(12) United States Patent
Ishikawa

(10) Patent No.: US 7,474,002 B2
(45) Date of Patent: Jan. 6, 2009

(54) SEMICONDUCTOR DEVICE HAVING DIELECTRIC FILM HAVING APERTURE PORTION

(75) Inventor: Akira Ishikawa, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 10/273,134

(22) Filed: Oct. 17, 2002

(65) Prior Publication Data

US 2003/0080436 A1 May 1, 2003

(30) Foreign Application Priority Data

Oct. 30, 2001 (JP) ............................ 2001-332052

(51) Int. Cl.
- H01L 23/48 (2006.01)
- H01L 29/40 (2006.01)
- G02F 1/13 (2006.01)
- G02F 1/1362 (2006.01)
- H01L 21/336 (2006.01)

(52) U.S. Cl. ............... 257/776; 257/776; 257/E23.134; 257/E27.111; 257/E29.137; 257/E29.278; 257/E29.282; 257/E29.283; 257/59; 257/72; 257/306; 257/310; 257/311; 257/68; 257/57; 257/700; 257/701; 257/758; 257/759; 257/751

(58) Field of Classification Search ................. 257/776, 257/E29.276, E23.134, E27.111, E29.137, 257/E29.278, E29.282, E29.283, 59, 72, 257/306, 308–311, 57, 774, 700, 701, 758, 257/759, 751, 68, 296, 350, 61, 71

See application file for complete search history.

(56) References Cited

U.S. PATENT DOCUMENTS

| 4,389,481 | A | | 6/1983 | Poleshuk et al. |
| 4,478,655 | A | * | 10/1984 | Nagakubo et al. ........... 438/151 |
| 4,720,739 | A | * | 1/1988 | Beasom ..................... 257/374 |

(Continued)

FOREIGN PATENT DOCUMENTS

CN 1292100 A 4/2001

(Continued)

OTHER PUBLICATIONS

English Abstract re Japanese Patent Application No. JP10-213813 published Aug. 11, 1998.

(Continued)

*Primary Examiner*—Alexander O Williams
(74) *Attorney, Agent, or Firm*—Cook Alex Ltd.

(57) ABSTRACT

In the semiconductor device having a structure in which a plurality of layers are built-up by layers made of different materials or layers including various formed patterns, it is an object to provide a method which smoothing surface can be achieved without a polishing treatment by CMP method or a smoothing process by depositing a SOG film, a substrate material is not chosen, and the smoothing is simple and easy. In the semiconductor device in which a plurality of different layers are formed, smoothing surface can be achieved without the polishing treatment by the CMP method or the smoothing process by depositing the SOG film to a dielectric film formed on a dielectric film and a wring (electrode) or a semiconductor layer in a manner that an aperture portion is formed in the dielectric film, the wring (electrode) or the semiconductor layer is formed in the aperture portion.

35 Claims, 18 Drawing Sheets

U.S. PATENT DOCUMENTS

| | | | | |
|---|---|---|---|---|
| 4,914,497 | A * | 4/1990 | Kondo | 257/296 |
| 4,990,984 | A * | 2/1991 | Misu | 257/360 |
| 5,151,761 | A * | 9/1992 | Takebuchi | 257/321 |
| 5,247,191 | A | 9/1993 | Yamazaki et al. | 257/72 |
| 5,569,935 | A * | 10/1996 | Takemura et al. | 257/51 |
| 5,587,329 | A * | 12/1996 | Hseuh et al. | 438/30 |
| 5,851,862 | A | 12/1998 | Ohtani et al. | 438/166 |
| 5,917,563 | A * | 6/1999 | Matsushima | 349/38 |
| 6,016,000 | A | 1/2000 | Moslehi | |
| 6,075,580 | A * | 6/2000 | Kouchi | 349/110 |
| 6,133,583 | A | 10/2000 | Ohtani et al. | 257/57 |
| 6,133,620 | A * | 10/2000 | Uochi | 257/649 |
| 6,248,666 | B1 * | 6/2001 | Frijlink et al. | 438/689 |
| 6,297,862 | B1 | 10/2001 | Murade | |
| 6,320,204 | B1 * | 11/2001 | Hirabayashi et al. | 257/71 |
| 6,331,722 | B1 * | 12/2001 | Yamazaki et al. | 257/347 |
| 6,356,319 | B1 * | 3/2002 | Park et al. | 349/43 |
| 6,407,393 | B1 * | 6/2002 | Kim et al. | 250/370.09 |
| 6,410,368 | B1 | 6/2002 | Kawasaki et al. | 438/145 |
| 6,423,973 | B2 * | 7/2002 | Choo et al. | 250/370.09 |
| 6,522,013 | B1 * | 2/2003 | Chen et al. | 257/774 |
| 6,590,227 | B2 * | 7/2003 | Ishikawa | 257/68 |
| 6,656,840 | B2 * | 12/2003 | Rajagopalan et al. | 438/687 |
| 6,700,133 | B1 | 3/2004 | Ohtani et al. | 257/66 |
| 6,850,292 | B1 | 2/2005 | Murade | 349/44 |
| 6,864,624 | B2 * | 3/2005 | Birecki et al. | 313/336 |
| 6,867,090 | B2 * | 3/2005 | Hiratani et al. | 438/243 |
| 6,869,858 | B2 * | 3/2005 | Jang et al. | 438/427 |
| 6,939,762 | B2 * | 9/2005 | Tsugane et al. | 438/253 |
| 2001/0010572 | A1 * | 8/2001 | Koma et al. | 349/130 |
| 2001/0015778 | A1 * | 8/2001 | Murade et al. | 349/43 |
| 2001/0022365 | A1 * | 9/2001 | Murade | 257/59 |
| 2001/0030323 | A1 * | 10/2001 | Ikeda | 257/59 |
| 2002/0014624 | A1 * | 2/2002 | Yamazaki et al. | 257/57 |
| 2002/0024622 | A1 * | 2/2002 | Murade | 349/44 |
| 2002/0055206 | A1 * | 5/2002 | Zhang | 438/145 |
| 2002/0100984 | A1 * | 8/2002 | Oshima et al. | 257/774 |
| 2002/0132392 | A1 * | 9/2002 | Nakatani et al. | 438/118 |
| 2003/0034554 | A1 * | 2/2003 | Onitani et al. | 257/705 |
| 2003/0141105 | A1 * | 7/2003 | Sugaya et al. | 174/256 |
| 2003/0161943 | A1 * | 8/2003 | Chen et al. | 427/97 |
| 2003/0230749 | A1 | 12/2003 | Isobe et al. | 257/59 |
| 2004/0114088 | A1 * | 6/2004 | Murade | 349/155 |

FOREIGN PATENT DOCUMENTS

| | | | |
|---|---|---|---|
| JP | 57-21867 | 2/1982 | |
| JP | 2-159057 | * 6/1990 | 257/E27.093 |
| JP | 8-8435 | 1/1996 | |
| JP | 8-97431 | 4/1996 | |
| JP | 9-213792 | 8/1997 | |
| JP | 10-213813 | 8/1998 | |
| JP | 2000-58843 | 2/2000 | |
| JP | 2000-208770 | 7/2000 | |
| JP | 2000-323714 | 11/2000 | |
| JP | 2001-100658 | 4/2001 | |
| JP | 2001-142089 | 5/2001 | |
| JP | 2001-185731 | 7/2001 | |
| JP | 2001-218680 | 10/2001 | |
| JP | 2001-281680 | 10/2001 | |

OTHER PUBLICATIONS

English Abstract re Japanese Patent Application No. JP 2001-100658 Published Apr. 13, 2001.

English Abstract re Japanese Patent Application No. JP 2001-218680 published Oct. 10, 2001.

Office Action re Chinese application No. CN 200210048136.9, dated Apr. 11, 2008 (with English translation).

* cited by examiner

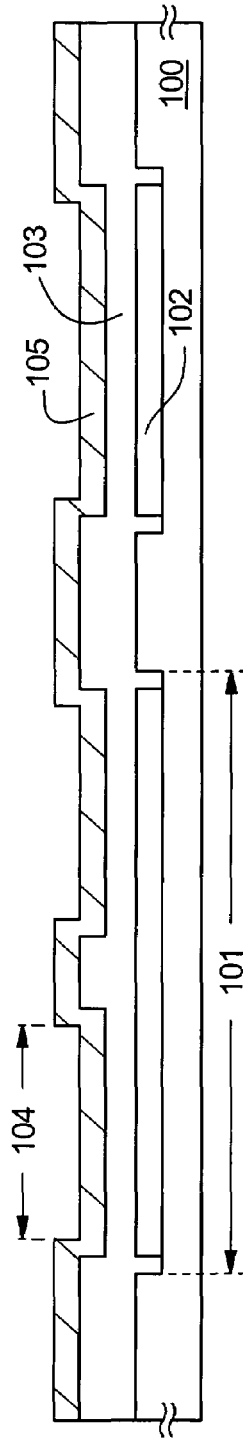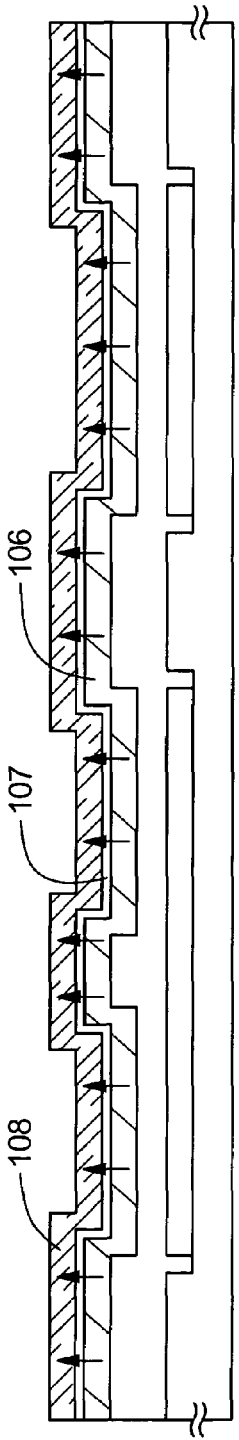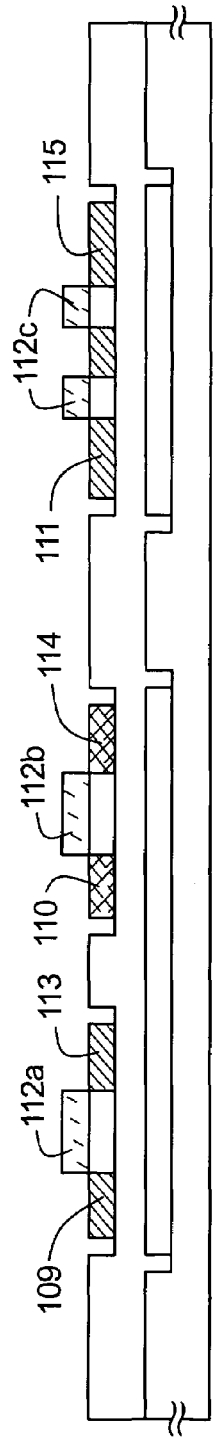

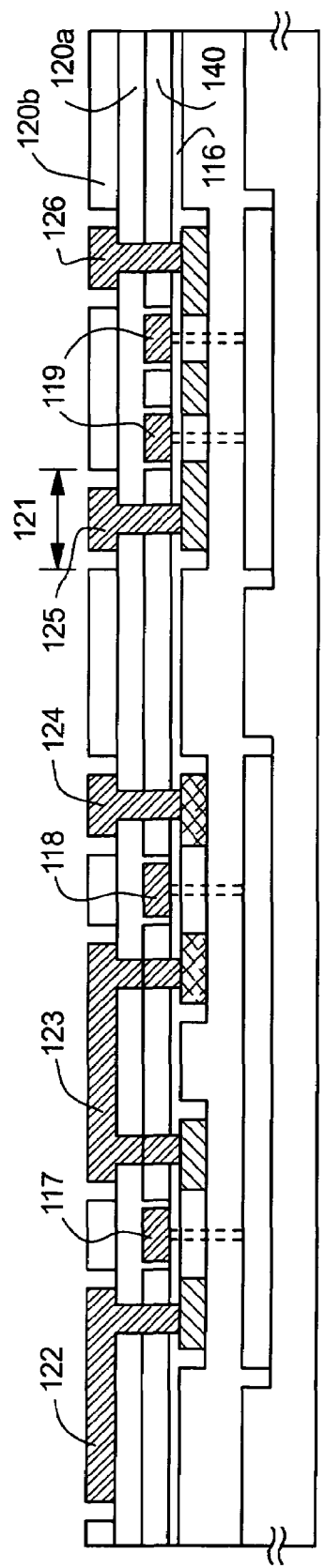
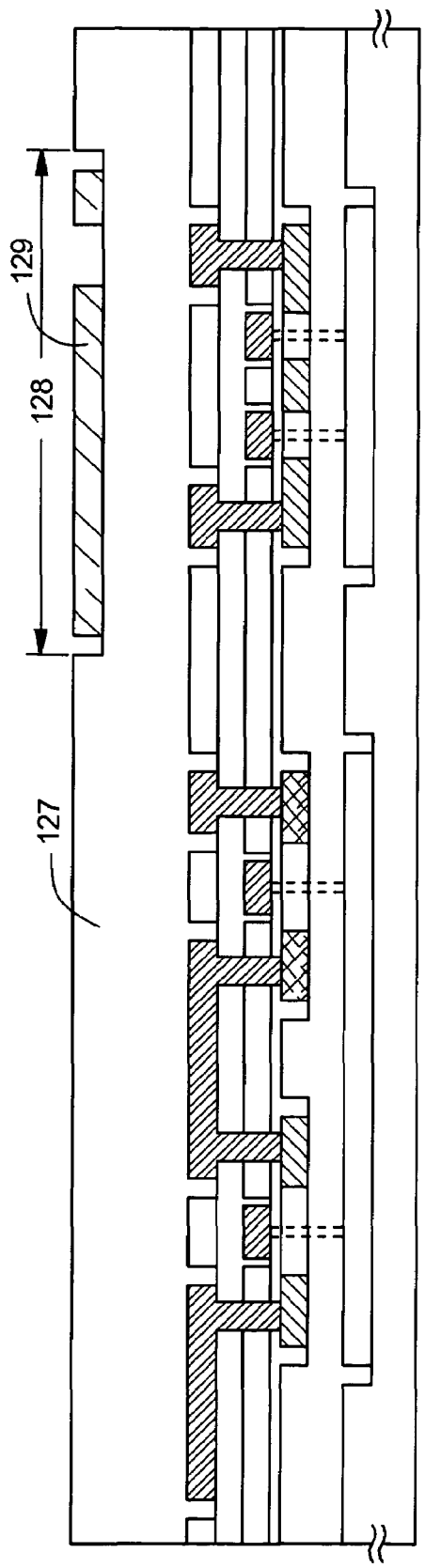
FIG. 5A
FIG. 5B

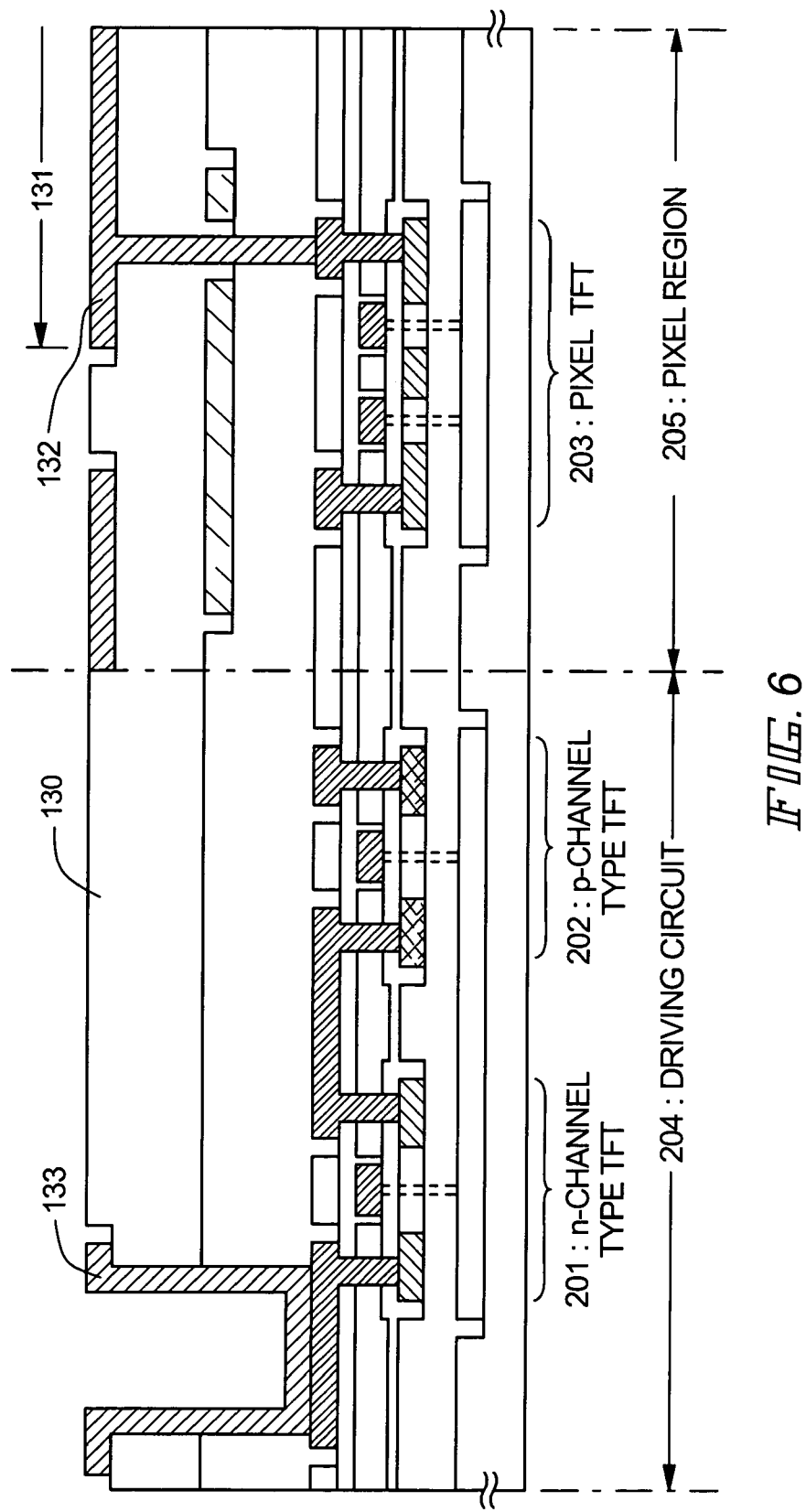

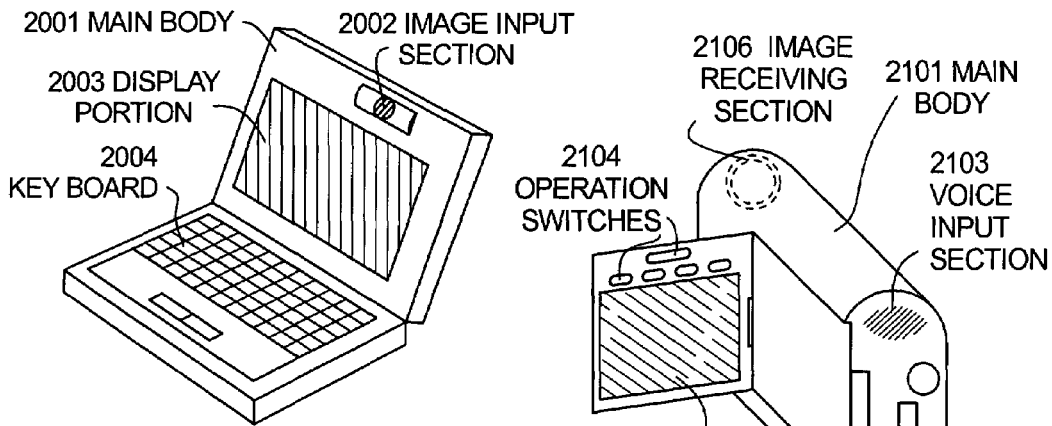
FIG. 14A
FIG. 14B
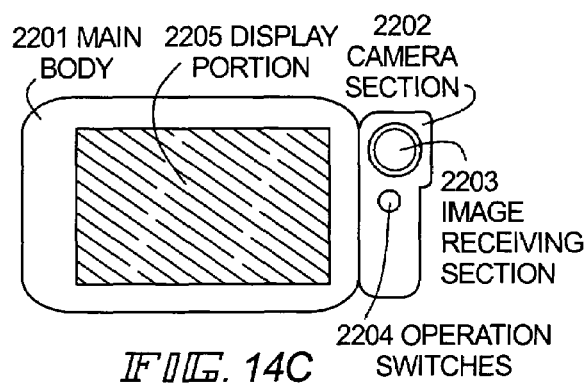
FIG. 14C
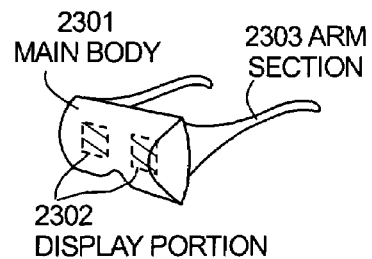
FIG. 14D
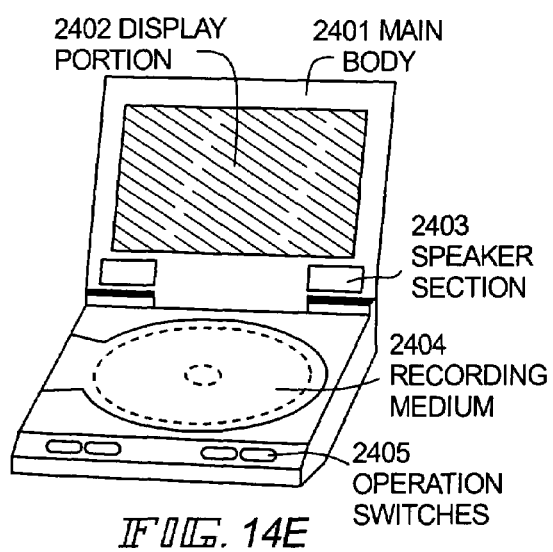
FIG. 14E
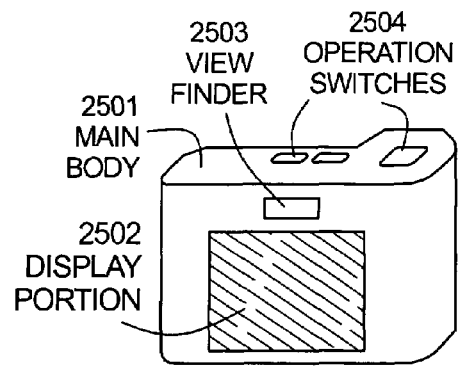
FIG. 14F

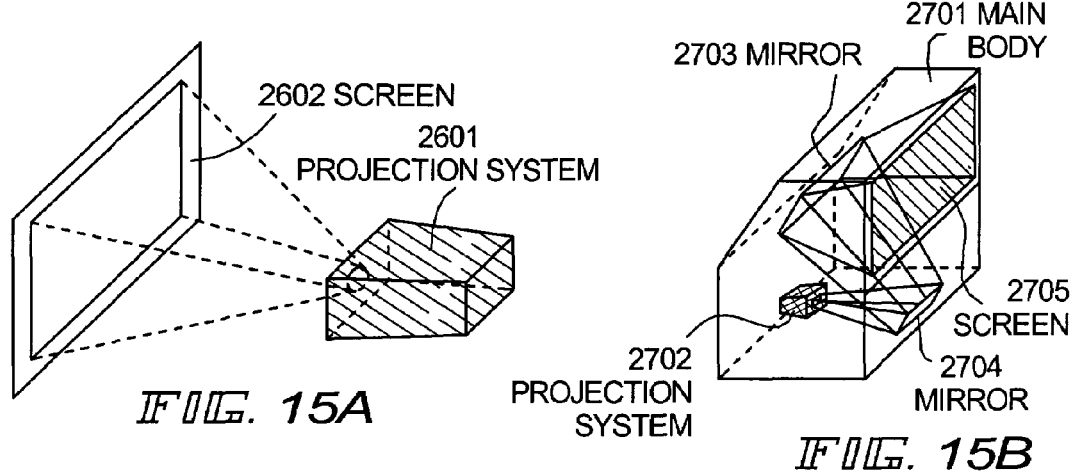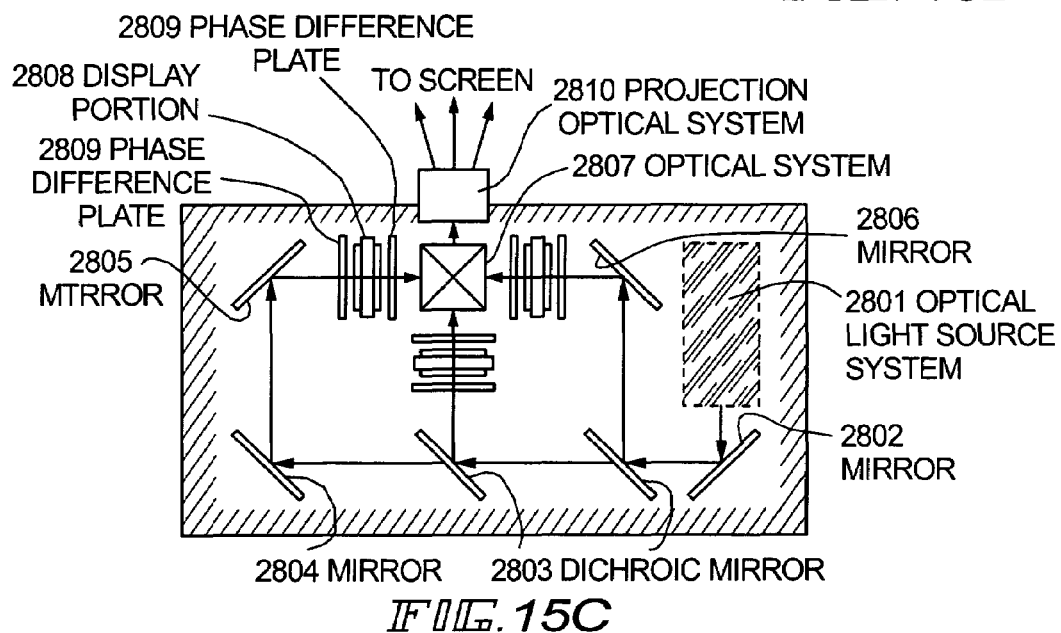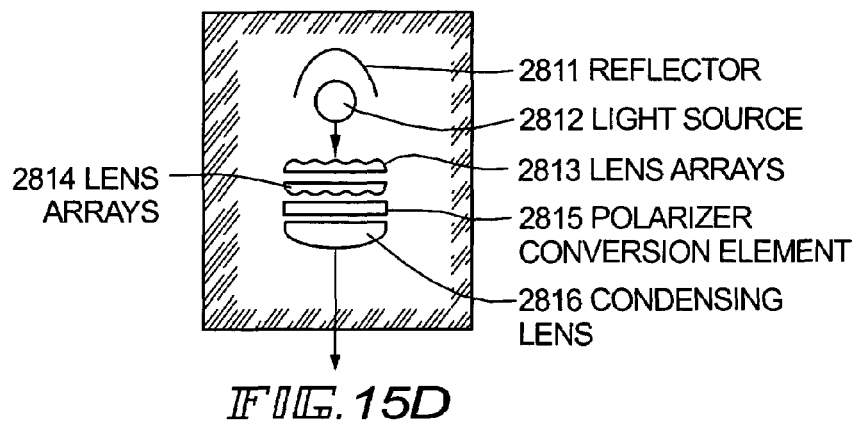

SEMICONDUCTOR DEVICE HAVING DIELECTRIC FILM HAVING APERTURE PORTION

BACKGROUND OF THE INVENTION

1. Field of the Invention

The present invention relates to smoothing technique without using special means for smoothing in a forming method of a semiconductor device which has a multilayered structure including different layers.

In the present specification, the semiconductor device has a multilayered structure including different layers contains a transistor, particularly a field-effect type of transistor, typically a MOS (Metal Oxide Semiconductor) transistor and a thin film transistor (TFT), a device using capacitance, an apparatus containing a circuit provided with the above-described devices, and an electric appliance containing the apparatus in a system.

2. Description of the Related Art

In recent years, a demand for down sizing, lightweight, low-cost is increasing more and more in an electric appliance containing a semiconductor device such as a video camera, a digital camera, a projector, a personal computer, a mobile computer, a mobile phone, and an electronic book. It is natural for users to demand for better performance even if the electric appliance is downsized and lightened, and the better performance is being demanded in the electric appliance. A function and the performance of the electric appliance depend on characteristics of LSI which constitutes a system of the electric appliance and characteristics of a display apparatus in a display portion of the electric appliance. Accordingly, research and development on miniaturization and integration concerning the semiconductor device such as the LSI and concerning a bright display and a microdisplay is being actively done. By improving a degree of the miniaturization and the integration, the more functions can be mounted on one chip, which permits the above-described demand for the down sizing, the lightweight and the low-cost of the electric appliance to be satisfied, and in the display apparatus finer image display can be realized by increasing the number of pixels.

And a technical development on the integration is proceeding in order to realize a system-on-chip in which devices such as an MPU, a memory, and an I/O interface constituting a system are mounted on one chip in monolithic and high speed, high reliability, and low electrical power consumption satisfy or a system-on-panel in which the system (functional circuit) is formed (mounted) on the same substrate as the panel.

It is not too much to say that a processing technique and an etching technique by reduced projection exposure decides a level of the miniaturization for proceeding integration and miniaturization of the semiconductor device. It is necessary to consider a surface of a substrate processed by projection exposure, though there is an issue of performance of a reduced projection aligner itself.

For example, in the semiconductor device formed by a multilayer including a plurality of layers with various materials and formed patterns, in case that the smoothing treatment is not done, as shown in FIG. 1A, when a second layer 2 is formed on a first layer 1 and a third layer 3 is formed on the second layer 2, a structure having a step reflecting difference of elevation between the first layer 1 and the second layer 2 is formed. In the same way, as a fourth layer 4 is formed on the third layer 3 and a fifth layer 5 is formed on the fourth layer 4, a resultant step 6 is increased.

Particularly, though wirings including a conductive film tend to reduce a line width for increasing integration, since the reduction of the line width increases resistance of the wirings, the increment of the resistance of the wirings is controlled by increasing a film thickness of the wirings. Consequently, the step (the evaluation between a convex portion and a concave portion in the semiconductor device) is increasing.

When the semiconductor device having an uneven shape on its surface is applied with a miniaturization treatment, processing according to a design can not be done because a focus of projection is warped by the uneven surface of the semiconductor device. When a film having the uneven surface is deposited, there is a problem that disconnection is created, because some materials for deposition have poor coverage. Since a focus margin is reduced in case of exposure treatment as a dimension to be processed is miniaturized, it is thought that there is necessity making a surface where the step of concavity and convexity exists within the focus margin.

In order to smooth the surface of the semiconductor device, a technique that a fifth layer 5a is formed with a surplus film thickness and a formed concave portion 7 affected by the fourth layer is polished by a CMP (Chemical Mechanical Polishing) method as shown in FIG. 1B or a method of smoothing by depositing a SOG film 8 as shown in FIG. 1C, has been thought.

In a liquid crystal display apparatus, there is also a problem that an uneven surface of interlayer dielectric from the wirings results in irregularly rubbing of an orientation film, disruption of alignment of liquid crystal is generated by the irregularly rubbing, which causes reduction of display quality. In the liquid crystal display apparatus, by using an organic dielectric film which is applied in a liquid state and heated, the organic dielectric film is deposited thick to form a flat surface.

In the semiconductor device in which the wirings are multilayered in order to increase the integration, parasitic capacitance is generated in a manner that wirings and gate electrodes formed in different layers are close to each other through the interlayer dielectric, which causes a problem that working speed is reduced. Accordingly, the interlayer dielectric tends to be formed thickly.

However, there &e a problem of dishing that polishing speed varies locally by density of pattern formed in a layer lower than a layer to be polished and a problem of contamination of the substrate caused by polishing wastage and waste (polishing) solution generated in a polishing treatment. There is a problem that a surface of the wirings is damaged by more polishing than necessity to reduce the reliability in the CMP method. There are a material being able to polish and a material being not able to polish in the CMP method, the CMP method can not be always applied to produce the all semiconductor devices.

Though it is thought that a dummy pattern is provided in order to eliminate a difference in density of pattern as a solution of the problem of dependence on the density of pattern described above, design flexibility is reduced by forming dummy pattern, and there is another problem that an open area ratio is reduced in the display apparatus.

It is possible that the polishing technique of the CMP method can apply to the semiconductor device formed on a silicon wafer and a quartz substrate which have flatness, however there is a problem that it is difficult that the CMP method applies to the semiconductor device formed on a large glass substrate and a flexible plastic substrate which have a large wave on their surface.

There are problems of planarization by using the SOG film described below. The SOG film is a film formed by heating treatment after a material for dielectric film dispersed in a solvent is coated on a surface of a wafer by a spin-coater. Though the SOG film is used as the planarization because the coated film is formed thinly in a concave portion and thickly in a convex portion by surface tension, the coated film causes corrosion of the metal wirings because of high hygroscopicity, which results the reliability to be reduced. For this reason additional process is required in order to form a film for protecting the metal wirings or a protective film for preventing moisture absorption, and as a result another problem of increment of process creates. In characteristics of the SOG film, there are problems such as high water penetration, easy deterioration, and easy cracking.

There is also a problem that many treatment steps are required for the smoothing treatment such that the SOG film is heated after the film material is coated to be equal to an oxide silicon film, furthermore the film in an unnecessary region is etched to remove and the protective layer is formed, and the film absorbs moisture during the process.

There is a problem that it is difficult to smooth an area where the number of elements per unit of area is large (for example, an area where circuits are close like a driving circuit and a functional circuit) and an area where the number of elements per unit of area is small (for example, an area like a pixel element where an open area is enlarged to extend an area in which light is transmitted) in the same state.

In the display apparatus, there is a problem that, when a kind of the film of the interlayer dielectric is different, index refraction is varied and the light is scattered to an unexpected direction at an interface to be incident on a semiconductor layer of the TFT, which causes light leak current.

In case that the wirings are multilayered to increase the integration, there are problems such that it takes long time to make a contact hole for conducting when the interlayer dielectric is formed thickly in order to reduce the parasitic capacitance generated between wirings in different layers, and since the formed contact hole has a large aspect ratio, a sufficient coverage is not achieved by sputtering deposition which is often used in case of forming wirings, which causes the wirings in a bottom surface of the contact hole not to be formed, accordingly reliability concerning the contact hole is reduced by disconnection of the wirings.

In view of the foregoing, it is an object of the invention to provide a method for smoothing easily without polishing treatment by the CMO method, smoothing treatment by the SOG film deposition and selecting substrate material in the semiconductor device formed by a multilayer including a plurality of layers with various materials and formed patterns. It is another object of the invention to provide a method of smoothing which is so contrived that thickening interlayer dielectric required for reducing parasitic capacitance generated between wirings of different layers is compatible with thinning interlayer dielectric required for increasing reliability concerning the contact hole.

SUMMARY OF THE INVENTION

In a semiconductor device whose multilayered structure has different layers, the present invention can smooth a surface of an dielectric layer and a wiring (electrode) or the dielectric film formed on a semiconductor layer without doing polishing treatment by the CMP method or deposition of the SOG film in a manner that an aperture portion is formed in the dielectric film and the wiring (electrode) or the semiconductor layer is formed in the aperture portion.

The invention may be applicable to the smoothing treatment of a part of a layer or the whole layer where a step of the semiconductor device exists. For example, in the semiconductor device including a transistor having the semiconductor layer, a gate insulator film, and a gate electrode, the wiring connecting electrically each transistor, and the interlayer dielectric film insulating the transistor from the wiring, the invention may be applicable to the smoothing treatment of a part of the steps or the whole steps which are generated by forming the semiconductor layer, a gate electrode, and the wiring.

By applying the invention, reliability concerning the contact hole can be increased without increasing delay from parasitic capacitance in a manner that a film thickness of the interlayer dielectric is thinned only in a position where a contact hole is formed to reduce an aspect ratio of the contact holes, and the film thickness is held in a region where the contact hole is not formed.

The invention comprises a first dielectric film having an aperture portion, a semiconductor layer formed in the aperture portion, and a second dielectric layer coating over the first dielectric layer and the semiconductor layer.

The invention comprises a first dielectric film having an aperture portion, an electrode formed in the aperture portion, and a second dielectric layer coating over the first dielectric layer and the semiconductor layer.

The invention comprises a dielectric film having an aperture portion and a wiring formed continuously from a bottom surface of the aperture portion to a surface outside the aperture portion of the dielectric film.

The invention comprises a first dielectric film having an aperture portion, a wiring formed continuously from a bottom surface of the aperture portion to a surface outside the aperture portion of the dielectric film, and a second dielectric layer coating over the first dielectric layer and the electric wiring, wherein, in the second dielectric layer, a contact hole reached to the electric wiring is formed at a position where the wiring is formed on the surface.

The invention comprises a first dielectric film having a first aperture portion, a wiring formed continuously from a bottom surface of the first aperture portion to a surface outside the aperture portion of the first dielectric film, and a second dielectric film coating over the first dielectric layer and the wiring and having a second aperture portion, wherein at least a part of the second aperture portion is formed on an upper portion of a position where the wiring is formed on the surface, and a contact hole reached to the electric wiring is formed at a position corresponding to the position of a bottom surface of the second aperture.

The invention comprises an dielectric film having a first aperture portion and a second aperture portion adjacent to the first aperture portion, and a wiring formed continuously from a bottom surface of the first aperture portion to a bottom surface of the second aperture portion through a surface of the dielectric film between the first aperture portion and the second aperture portion.

The invention comprises a first dielectric film having a first aperture portion and a second aperture portion adjacent to the first aperture portion, a wiring formed continuously from a bottom surface of the first aperture portion to a bottom surface of the second aperture portion through a surface of the first dielectric film between the first aperture portion and the second aperture portion, and a second dielectric film coating over the first dielectric layer and the wiring, wherein, in the second dielectric film, a contact hole reached to the wiring is formed at a position where the wiring is formed on a surface of the second dielectric film between the first aperture portion and the second aperture portion.

The invention comprises a first dielectric film having a first aperture portion and a second aperture portion adjacent to the first aperture portion, a wiring formed continuously from a bottom surface of the first aperture portion to a bottom surface of the second aperture portion through a surface of the first dielectric film between the first aperture portion and the second aperture portion, and a second dielectric film coating over the first dielectric layer and the wiring and having a third aperture portion, wherein at least a part of the third aperture portion is formed on an upper portion of a position where the wiring is formed on a surface of the first dielectric film between the first aperture portion and the second aperture portion, and a contact hole reached to the electric wiring is formed at a position corresponding to the position of a bottom surface of the second aperture portion.

The invention comprises a dielectric film having an aperture portion which is formed with the dielectric film remained in an island shape inside the aperture portion and a wiring formed continuously inside the aperture portion and on an upper portion of the dielectric film remained in the island shape.

The invention comprises a dielectric film having an aperture portion which is formed with the dielectric film remained in an island shape inside the aperture portion, a wiring formed continuously inside the aperture portion and on an upper portion of the dielectric film remained in the island shape, and a second dielectric film coating over the first dielectric film and the conductive layer, wherein, in the second dielectric film, a contact hole reached to the wiring is formed at a position where the dielectric film remained in the island shape is formed.

The invention comprises a dielectric film having a first aperture portion which is formed with the dielectric film remained in an island shape inside the aperture portion, a wiring formed continuously inside the first aperture portion and on an upper portion of the dielectric film remained in the island shape, and a second dielectric film coating over the first dielectric film and the wiring and having a second aperture portion, wherein at least a part of the second aperture portion is formed on an upper portion of a position where the wiring is formed on a surface of the first dielectric film between the first aperture portion and the second aperture portion, and a contact hole reached to the wiring is formed at a position corresponding to the position of a bottom surface of the second aperture portion.

In the invention, a value of a depth of an aperture portion is equal to a value of a thickness of an electric wiring.

The invention comprises an dielectric film having an aperture portion, an active layer, a gate insulator film formed to cover the active layer, a gate electrode formed on an upper portion of the active layer and the gate insulator film, wherein the active layer, the gate insulator film, and a part of the gate electrode or the whole gate electrode are formed in the aperture portion of the dielectric film. A value of a depth of the aperture portion is not lower than a value of a thickness of an active layer and not more than a value of a sum of the thickness of the active layer, a thickness of a gate insulator film, and a thickness of a gate electrode. To a source region and a drain region of the active layer, an intermediate electric wiring is connected through the gate insulator film and a contact hole provided in an dielectric film formed on an upper portion of the gate insulator film. A thickness of the intermediate electric wiring is equal to a thickness of a gate electrode.

BRIEF DESCRIPTION OF THE DRAWINGS

FIGS. 4A to 4C show an example of an embodiment of the invention;
FIG. 5A and FIG. 5B show an example of an embodiment of the invention;
FIG. 6 shows an example of an embodiment of the invention;
FIGS. 14A to 14F show an example of an electric appliance;
FIGS. 15A to 15D show an example of an electric appliance.

DETAILED DESCRIPTION OF THE INVENTION

The invention is applicable to all layers or a part of layers in which a step is generated in a semiconductor device.

In the specification, to form an aperture portion shall indicate to form a concavity in a selected region of a (dielectric) film by etching, and also to indicate to stop etching halfway through film thickness (at a position shallower than the film thickness) or to etch to the depth of film thickness in the depth direction of the (dielectric) film.

In the specification, to form a contact hole shall indicate both to remove an interlayer dielectric to make a hole reached to a semiconductor layer and to make a hole for connecting electric wirings formed in different layers in order to form the electric wiring connecting electrically each TFT.

In the specification, that the film thickness of the electric wiring, an electrode or the semiconductor layer corresponds to the depth of the aperture portion shall indicate an error range between the film thickness and the depth of the aperture portion is in a comparable range of an in-plane distribution of the film thickness of a formed film.

DESCRIPTION OF THE PREFERRED EMBODIMENTS

[Embodiment Mode]

A method for forming semiconductor device (TFT) by applying the invention will be described referring to FIGS. 2A to 2E and FIGS. 3A to 3E.

An underlying dielectric film 11 is formed on a substrate 10. A dielectric substrate such as a glass substrate, a quartz substrate, and a crystal glass, a ceramic substrate, a stainless substrate, a metal substrate such as tantalum, tungsten, and molybdenum, a semiconductor substrate, and a plastic substrate such as polyimide, acryl, polyethylene terephthalate, polycarbonate, polyallylate, and polyethersulfone can be used as the substrate. A preferable substrate may be selected from the above-described substrates by considering necessity of a transparency and a maximum temperature of a process.

Figure 2A:
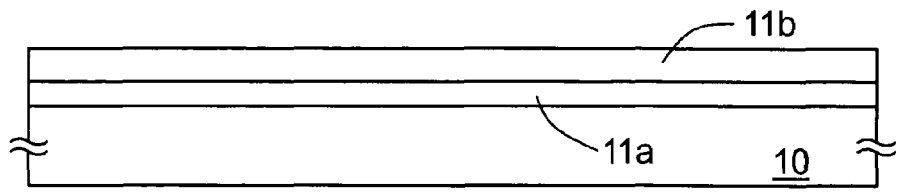
FIGS. 2A to 2E show an embodiment of the invention.

The underlying dielectric film 11 may be formed from a dielectric film such as a silicon oxide film, a silicon nitride film, and a silicon nitride-oxide film from 10 to 650 nm (preferably 50 to 600 nm) in thickness (FIG. 2A).

An aperture portion 12 is formed in the underlying dielectric film 11, and then a semiconductor film 13 is formed. When the underlying dielectric film 11 is formed by using layers made of different materials, particularly layers formed by films having a high selection ratio of etching to a certain etchant, for example, when a silicon nitride film 11a as a first layer and a silicon oxide film 11b as a second layer are formed, the underlying dielectric film of the first layer serves as an etching stopper, and the aperture portion can be formed with high controllability.

Figure 2B:
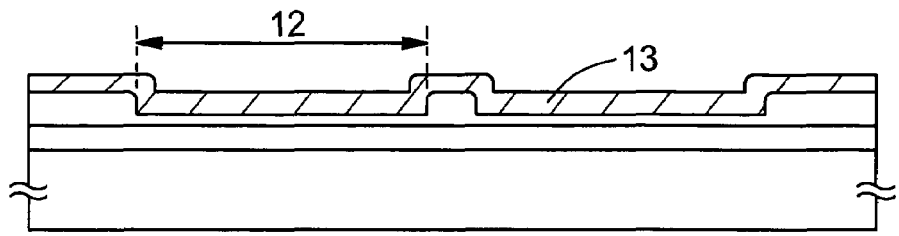
Figure 2C:
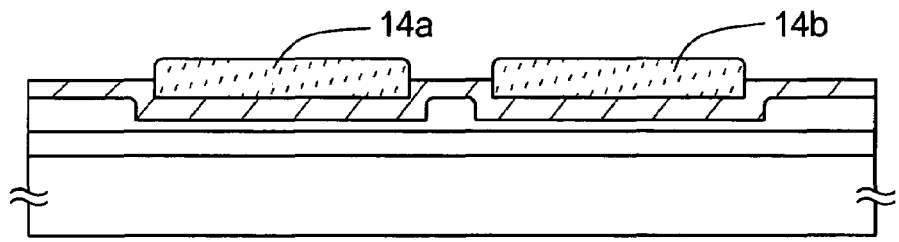
Figure 2D:
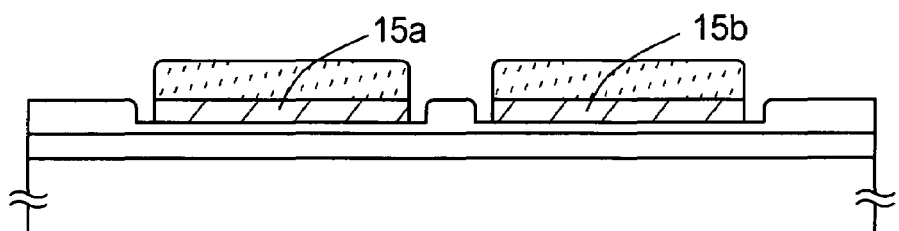

The forming control of the aperture portion can be also done by concentration of the etchant or treatment time of the etching other than by providing the underlying dielectric film as the etching stopper. Silicon or a semiconductor film (for example, $Si_XGe_{1-X}$ film: 0<X<1) containing mainly silicon may be used as the semiconductor film 13. In the embodiment, an amorphous silicon film 13 is deposited (FIG. 2B). In the aperture portion 12, a mask 14 made from a resist is formed on the amorphous silicon firm 13 to make a desirable shape (FIG. 2C) and etched to form a semiconductor layer 15. Crystallization treatment of the semiconductor film may be done before or after the etching treatment. A known crystallization treatment (laser crystallization method or heating crystallization method) or a crystallization method in which a catalytic element is added to perform a heating treatment may be used as the crystallization method. A height of the underlying dielectric film 11b is approximately equal to the height of the semiconductor layer 15 up to this step. With respect to the etchant for forming aperture portion, though wet etching is assumed in the embodiment, dry etching may be done without problems.

Then, a gate insulator film 16 is formed. The gate insulator film 16 is made from a dielectric film including silicon and having a thickness from 20 to 150 nm, by using a low-pressure CVD method, a plasma CVD method or a spattering method. In case that silicon oxide is used as the gate insulator film, by utilizing the plasma CVD method, TEOS (Tetraethyl Ortho Silicate) and $O_2$ are mixed, reaction pressure is set for 40 Pa, substrate temperature is set for 300 to 400° C., and the plasma is discharged at high-frequency (13.56 MHz) power density of 0.5 to 0.8 W/cm$^2$ to form the film. After that, the produced silicon oxide film is subjected to a heating treatment at 400 to 500° C. to obtain a good characteristics as the gate insulator film. Since the height of the underlying dielectric film 11b is approximately equal to the height of the semiconductor layer 15, a surface of the gate insulator film 16 can be approximately flat without smoothing treatment such as a polishing treatment by the CMP method.

A gate electrode 17 is formed on the gate insulator film 16. The gate electrode 17 may be made of an element selected from Ta, W, Ti, Mo, Cu, Cr, and Nd or an alloy material or a compound material which contains mainly the above-described elements. A semiconductor film typified by a crystal silicon film doped with an impurity element such as phosphorus may be also used. Also, An alloy material made of Ag, Pd and Cu may be used. Other than single-layered structure, a multi-layered structure of the conductive films may be employed. When the gate electrode is formed by using these materials, however, it is essential to use a material which is endurable to a later heat treatment.

An impurity element is doped into semiconductor layers 15a and 15b by using the gate electrode 17 as a mask. The impurity element in high concentration is doped in a region where the impurity element is doped, in order to be a source region or a drain region later. The impurity element (typically phosphorus) giving a n-type may be doped in a region where a n-channel type of TFT is formed, while the impurity element (typically boron) giving a p-type may be doped in a region where a p-channel type of TFT is formed. A LDD (Light Doped Drain) region where the impurity element is contained in low concentration may be formed if necessary.

Figure 2E:
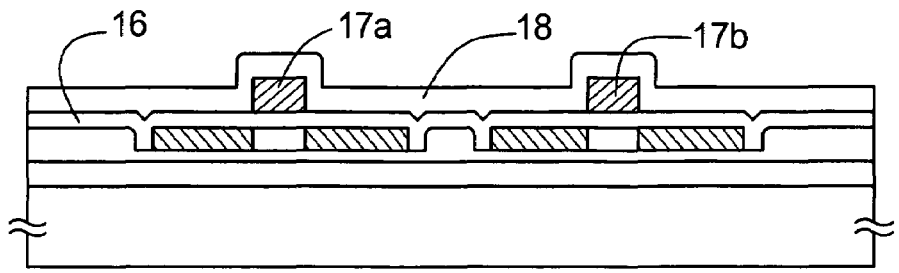

Then, a first interlayer dielectric film 18 is formed. The first interlayer dielectric film 18 is made from a dielectric film having a thickness from 10 to 200 nm and including silicon such as SiON, SiNO, SiO, and SiN, by using the plasma CVD method, the low-pressure CVD method, a normal-pressure CVD method or the spattering method (FIG. 2E).

Figure 3A:
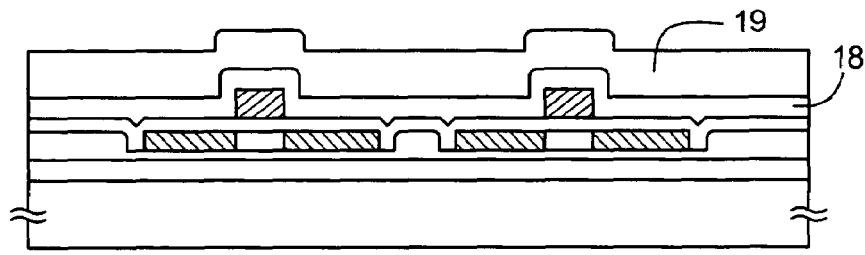
FIGS. 3A to 3E show an embodiment of the invention.

A second interlayer dielectric film 19 is formed. A second interlayer dielectric film (A) 19 may be made from a dielectric film having a thickness from 500 to 800 nm and including silicon such as SiON, SiNO, SiO, and SiN, by using the plasma CVD method, the low-pressure CVD method, a normal-pressure CVD method or the spattering method (FIG. 3A).

Figure 3B:
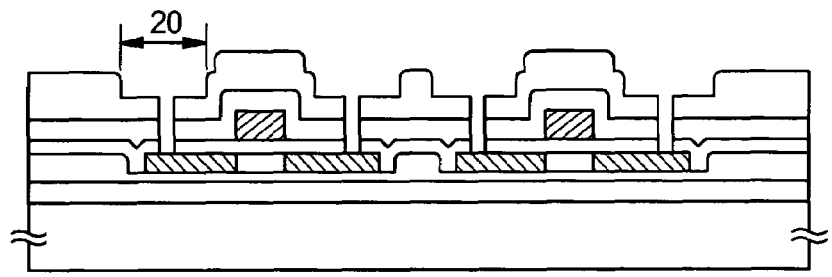
Figure 3C:
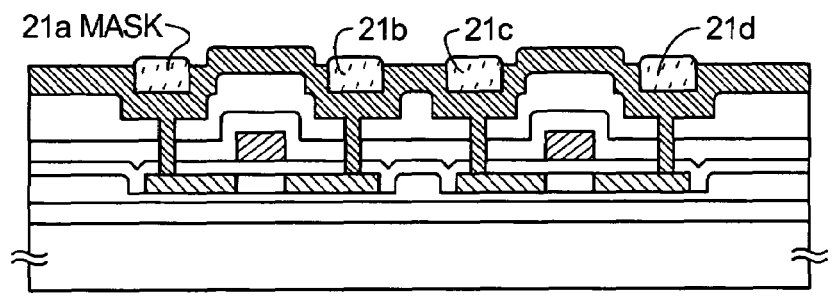

An aperture portion 20, in which an electric wiring connecting electrically each TFT is formed later, is formed in the second interlayer dielectric film (A) 19. In case that first interlayer dielectric film 18 and the second interlayer dielectric film 19 are formed by using a material (for example, the first interlayer dielectric film: a SiN film, the second interlayer dielectric film: a SiG film) having the high selection ratio of the etching to a certain etchant, since the first interlayer dielectric film 18 can be used as the etching stopper, control of depth direction can be done easily in forming aperture portion 20. Without distinguishing the first interlayer dielectric film from the second interlayer dielectric film, the same films may be formed to control the formation of the aperture portion by the concentration of the etchant or the etching time. A contact hole reaching to the semiconductor layer is formed on a bottom surface of the aperture portion 20 (FIG. 3B).

Figure 3D:
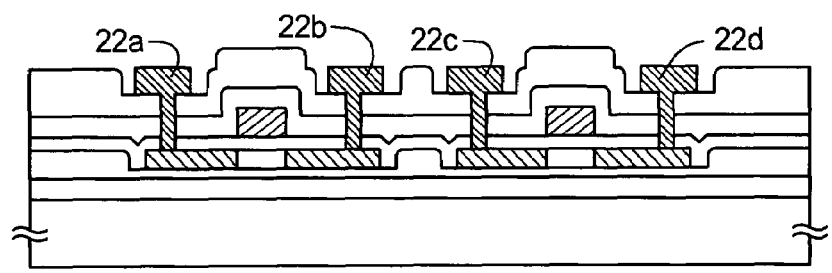

A conductive material such as Al, Ti, Mo, and W or a material containing these elements is deposited from about 300 to about 500 nm in thickness, masks 21a to 21d are formed (FIG. 3C), electric wirings 22a to 22d connecting electrically each TFT are formed by etching the conductive film in an unnecessary region (FIG. 3D).

Figure 3E:
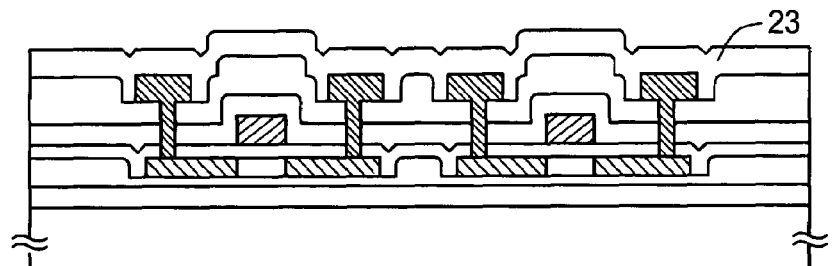

A second interlayer dielectric film (B) 23 is formed. The second interlayer dielectric film (B) 23 may be also made from a dielectric film having a thickness from 200 to 500 nm and including silicon such as SiON, SiNO, SiO, and SiN, by using the plasma CVD method, a TEOS-CVD method or the spattering method. The first interlayer dielectric film 18, the second interlayer dielectric film (A) 19, and the second interlayer dielectric film (B) 23 are formed of the same kind of an inorganic dielectric film (FIG. 3E).

A purpose of the smoothing treatment is to control a degree of concavity and convexity of a surface within a tolerance level. Accordingly, in case that the concavity and convexity resulted from abbreviation of the smoothing process is in the tolerance level, the smoothing process may be abbreviated. In case that the smoothing process forces remarkable difficulty to a post-process, there is also a desirable case when the smoothing process dare not to be done. In the embodiment, it is assumed that reduction of difficulty of a process doping the impurities into the semiconductor layer has priority, an example which abbreviates the smoothing process of a step resulted from the gate electrode is shown.

Though the step resulted from the gate electrode 17 is not smoothed in the embodiment, the step can be also smoothed. An example will be explained referring to FIGS. 18A to 18C. After a semiconductor layer 33 and a insulator film 30 are formed, a dielectric film 31 is deposited with a same film thickness as a gate electrode 32 formed in a post-process. An aperture portion having a shape containing the semiconductor layer 33 and the gate electrode 32 to be formed later inside is formed by etching the dielectric film 31. Then, the gate electrode 32 is formed in the aperture (FIG. 18A).

Figures 18A, 18B, 18C:
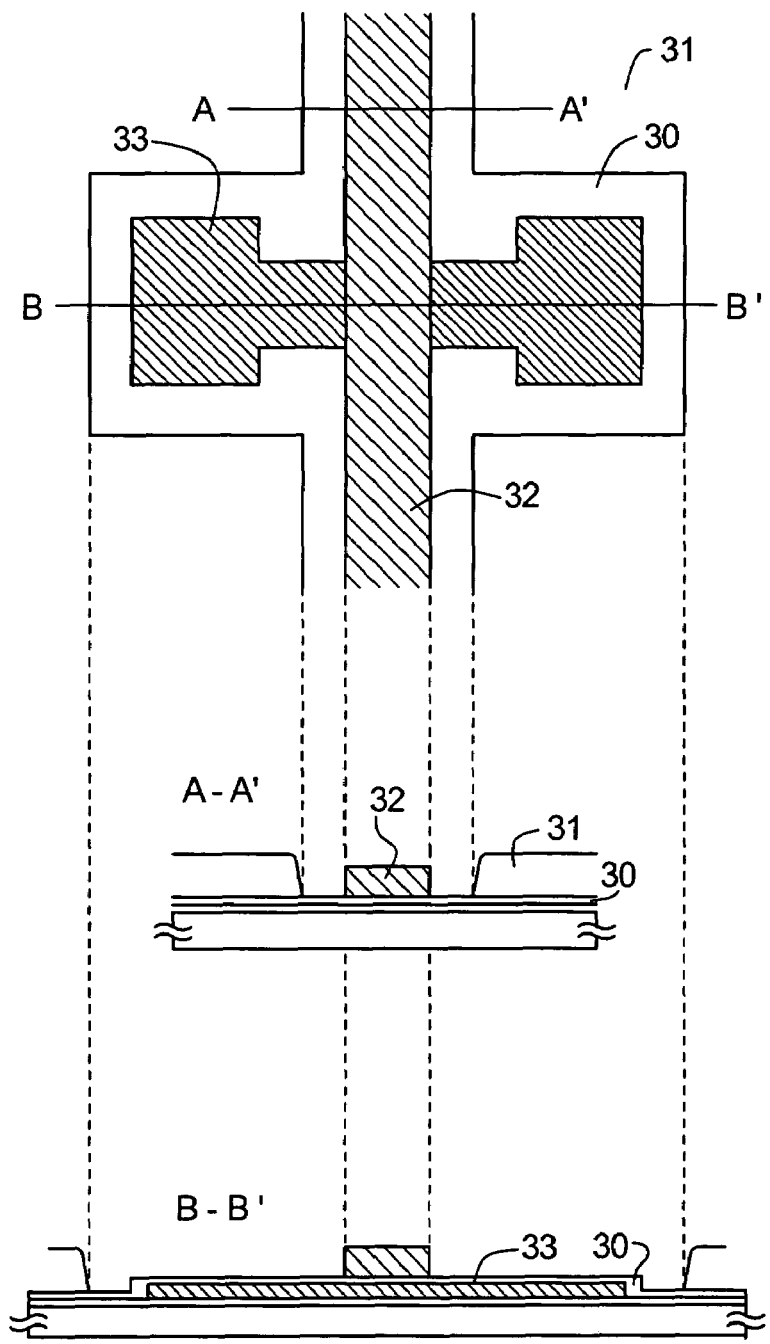
FIGS. 18A to 18C show an example of an embodiment of the invention.

FIG. 18B is a cross-sectional view taken on a line A–A' of FIG. 18A. Since a step resulted from a portion where the gate electrode 32 is taken around as the electric wiring (a portion where the semiconductor layer 33 is not overlapped) is formed in the aperture portion having a depth as deep as a thickness of the gate electrode 32, the smoothing can be almost achieved when an interlayer dielectric film coating over the gate electrode 32 is formed.

FIG. 18C is a cross-sectional view taken on a line B–B' of FIG. 18A. Since the dielectric film 31 does not exist on the semiconductor layer 33, it is not difficult to dope the impurities into the semiconductor layer 33.

Because FIGS. 18A to 18C show a method for smoothing the step resulted only from the gate electrode, there is the step resulted from the semiconductor layer 33 in FIG. 18C. The smoothing of the step shown in FIG. 18C may be achieved by another smoothing process in the same way as shown in FIG. 2A to FIG. 2E. In case that the step resulted from the semiconductor layer 33 is smaller compared with the step resulted from the gate electrode 32, the former smoothing may be abbreviated without problems.

By selecting properly the depth of the aperture formed in the dielectric film 31 from the depth corresponding to the thickness of the semiconductor layer 33 to the depth corresponding to the sum of the thickness of the semiconductor layer 33 and the thickness of the gate electrode 32, the smoothing process can be achieved according to the purposes by smoothing only the thickness of the semiconductor layer 33 or up to the sum of the thickness of the semiconductor layer 33 and the gate electrode 32.

Though the dielectric film 31 is formed after the gate insulator film 30 is formed in the example shown in FIGS. 18A to 18C, the gate insulator film 30 may be formed, in the reverse order after the dielectric film 31 is deposited and the aperture portion is formed. In the example shown in FIG. 2A to FIG. 2E, the smoothing process may be done, assuming that the thickness of the underlying dielectric film 11b is approximately equal to the sum of thickness of the semiconductor layer 33 and the gate electrode 32 or to the thickness of the gate electrode 32.

In a concave portion generated on a source region and a drain region in FIG. 18C, a contact is formed after further one more dielectric film is coated, a conductive layer (intermediate electric wiring) relaying a source wiring and a drain wiring to an active layer may be formed. When the thickness of the conductive layer is almost the same as the thickness of the gate electrode, the concave portion can be used for smoothing conductive layer.

Although, the invention is applied to a production process of TFT in the embodiment, the invention is not limited to the production process of TFT, and can be applied to semiconductor integrated circuits such as IC, LSI, and CCD, an EL display apparatus, a CMOS sensor, FED using TFT, and a solar cell.

Embodiments (Embodiment 1)

A method of manufacturing an active matrix substrate is explained in Embodiment 1 using FIGS. 4A to 6. A substrate on which driver circuits, and switching elements in the pixel portion (the pixel TFTs) and storage capacitor elements are formed is referred to as an active matrix substrate in the present specification, for convenience.

First, a substrate made from glass, such as barium borosilicate glass or aluminum borosilicate glass, typically Corning Corp. #7059 glass, #1737 glass, quartz substrates, single crystal silicon substrates, and metallic substrates and stainless steel substrates on which an insulating film is formed and the like may be used as a substrate. Further, plastic substrates having heat resistant properties capable of withstanding the processing temperatures of Embodiment 1 may also be used. A quartz glass substrate is applied in Embodiment 1.

The first opening portion 101 for forming a lower portion light shielding film 102 is formed next on the quartz substrate 100. The lower portion light shielding film 102 is formed from conductive materials or a laminate structure composed of Ta, W, Cr, and Mo that having heat resistant properties capable of withstanding the processing temperatures of this embodiment, or conductive materials composed of said elements-based alloy, at a film thickness on the order of 300 nm. The lower portion light shielding film 102 functions as a gate wiring, so that it is also referred to as a gate wiring. A 75 nm thick crystalline silicon film is formed in Embodiment 1, and after forming a 150 nm thick WSix film (where x=2.0 to 2.8), and the lower portion light shielding film 102 (the gate wiring) is etched to be formed. Note that although a single layer structure is used as the lower portion light shielding film (the gate wiring) 102 in Embodiment 1, a laminate structure having two or more layers may also be used. The insulating film may be formed before that the lower portion light shielding film 102 is formed in order to prevent the dispersion of pollution materials from the substrate.

A base insulating film 103 is then formed on the substrate 100 and the lower portion light shielding layer (gate wiring) 102 having a film thickness of 10 to 650 nm (preferably between 50 and 600 nm) from an insulating film such as a silicon oxide film formed by LPCVD at high temperature of 800° C., a silicon nitride film, or a silicon oxynitride film. A single layer structure is used as the base insulating film 103 in Embodiment 1, but a laminate structure in which two or more layers of the insulating films are laminated may also be used to prevent the diffusion of pollution materials. A silicon oxynitride film made formed by plasma CVD using $SiH_4$, $NH_3$, and $N_2O$ as reactant gas is formed as the base insulating film 103 in Embodiment 1. The silicon oxynitride film (Si=32%, O=27%, N=24%, H=17%) is formed at 400° C. having a film thickness of 580 nm (FIG. 4A).

Next, the second opening portion 104 is formed on the base insulating film 103. The second opening portion 104 can adjust the formation of the opening portion according to the density of the etchant and the process time of the etching. When the first and second layers of the base insulating film 103 are formed by the material that have large selective ratio of etching is large to the etchant, and the second layer of the base insulating film is formed to have a same thickness of the desired depth of the opening portion, thereby the control of the depth direction of the opening portion is easy to control.

An amorphous semiconductor film 105 is formed next (FIG. 4A). An amorphous semiconductor film 105 is formed out of a semiconductor film having an amorphous structure with a thickness of 25 to 80 nm (preferably between 30 and 60 nm) by a known means such as sputtering, LPCVD or plasma CVD. There are no limitations placed on the semiconductor film material, but it is preferable to form the semiconductor film from silicon, a silicon germanium (SiGe) alloy, or the like.

Thermal crystallization using a catalyst such as nickel is then performed to crystallize the semiconductor film. Further, in addition to thermal crystallization using a catalyst such as nickel, a known crystallization process (such as laser crystallization or thermal crystallization) may also be combined to be performed. An aqueous nickel acetate solution (per weight concentration 10 ppm, volume 5 ml) is applied to the entire surface of the film by spin coating to form catalytic element contained layer, and the heat treatment is performed thereon for 12 hours at a temperature of 600° C. in a nitrogen atmosphere.

Further, the crystallization may be executed by performing the laser crystallization method together with the thermal crystallization method adding the catalytic element. If a laser crystallization method is also applied, a gaseous state laser, a solid laser of a pulse oscillation laser or a continuous oscillation can be used. Examples of gaseous state lasers are excimer lasers, Ar lasers, Kr lasers, while YAG lasers, $YVO_4$ lasers, YLF lasers, $YAlO_3$ lasers, glass lasers, ruby lasers, alexandrite lasers, and Ti: sapphire lasers, may be used as solid state lasers. If these lasers are used, a method in which a laser beam emitted from a laser oscillator is condensed into a linear shape, rectangular shape or elliptical shape by an optical system may be used. Conditions for crystallization may be suitably set by the operator, but the pulse oscillation frequency is set to 300 Hz and the laser energy density is set to from 100 to 800 $mJ/cm^2$ (typically between 200 and 700 $mJ/cm^2$) if an excimer laser is used. Further, the second harmonic is utilized if a YAG laser is used, the pulse oscillation frequency is set to form 1 to 300 Hz, and the laser energy density is preferably set between 300 and 1000 $mJ/cm^2$ (typically from 350 to 800 $mJ/cm^2$). The laser beam, condensed into a linear shape with a width of 100 to 1000 μm, for example 400 μm, may then be irradiated over the entire substrate surface. In the case that a $YVO_4$ laser is used, the laser light emitted from the continuous oscillation a $YVO_4$ laser of 10 W output is converted by the non-linear optical elements, and harmonic is emitted by insert $YVO_4$ crystals and the non-linear optical elements in a laser oscillator. Furthermore, it is necessary for the energy density to be set to from 0.01 to 100 $MW/cm^2$ (preferably from 0.1 to 10 $MW/cm^2$) if an $YVO_4$ laser is used. It is then preferable to irradiate the laser light by moving a stage relative to the laser beam at a speed of 0.5 to 2000 cm/s.

Next, the gettering is performed to remove the catalyst element from the obtained crystalline silicon film 106. Furthermore, an oxide film (referred to as "chemical oxide") is formed using an ozone containing aqueous solution (typically ozone water) to thereby form a barrier layer 107 on the crystalline silicon film 106 which consists of the oxide film and has a total thickness of 1 to 10 nm. A semiconductor layer 108 (also referred to as the gettering element) containing a rare gas element is formed on this barrier layer 107 (FIG. 4B). This barrier layer 107 functions as an etching stopper when only the semiconductor layer 108 (the gettering region) is selectively removed in a later step. Even if an aqueous solution in which sulfuric acid, hydrochloric acid, nitric acid or the like is mixed with oxygenated water, in place of the ozone containing aqueous solution is used, the chemical oxide can be formed. Alternatively, as another method of forming the barrier layer 107, ultraviolet rays may be irradiated to the semiconductor film having a crystal structure in an oxygen atmosphere to thereby generate ozone and to oxidize the surface of the semiconductor film. As yet another formation method, the barrier layer 107 may be formed by depositing an oxide film having a thickness of about 1 to 10 nm by the plasma CVD method, the sputtering method, the evaporation method or the like. Further, as still another method, a thin oxide film may be formed as the barrier layer 107 by heating the semiconductor film up to about 200 to 350° C. in a clean oven. The barrier layer 107 is formed to have a sufficient film property or thickness to enable nickel contained in the crystalline semiconductor film 106 to move to the gettering region 108 in a later gettering step.

A semiconductor layer 108 containing a rare gas element is formed by the sputtering method. As the rare gas element, one or a plurality of elements selected from among helium (He), neon (Ne), argon (Ar), krypton (Kr) and xenon (Xe) are employed. Among them, argon (Ar) that is inexpensive gas, is preferable. In this embodiment, a target which consists of silicon is used in a rare gas element containing atmosphere to form the gettering region 108. Furthermore, if the gettering region is formed using a target containing phosphorus which is a one conductive type impurity element, not only gettering by the rare gas element but also gettering using the Coulomb force of phosphorus can be conducted. In addition, since nickel tends to move to a region having a high oxygen density during the gettering, it is preferable that the concentration of oxygen contained in the gettering region 108 is set higher than that of oxygen contained in the crystalline silicon film 106, e.g., not lower than $5 \times 10^{18}/cm^3$.

Thereafter, a heat treatment is carried out to conduct gettering for decreasing the concentration of the catalyst element (nickel) in the crystalline silicon film 106 to remove the catalyst element (nickel) by moving to the gettering region 108. As the heat treatment for the gettering, a treatment for applying strong light or an ordinary heat treatment may be conducted. Nickel is hardly contained in the crystalline silicon film 106. Namely, gettering is sufficiently conducted so that the nickel concentration of the film becomes not higher than $1 \times 10^{18}/cm^3$, preferably not higher than $1 \times 10^{17}/cm^3$ (FIG. 4B).

Next, using the barrier layer 107 as an etching stopper, only the gettering region 108 is removed and then the barrier layer 107 consisting of the oxide film is removed using fluorine containing etchant.

On the second opening portion 104, masks are formed on the crystalline silicon film 106, and etching the film of the unnecessary region is then performed to form semiconductor layers 109 to 111 in the second opening portion 104. The insulating film is formed, and heat treatment processing is performed in order to increase the crystallinity of the semiconductor film. It is preferable to thermally oxidize an upper portion of the semiconductor film before the patterning formation of the semiconductor layers 109 to 111. Heat treatment is performed using an annealing furnace after forming a 20 nm thick silicon oxide film by using an LPCVD apparatus. Upper portions of the semiconductor layers are oxidized by this process. If the silicon oxide film and the oxidized portions of the semiconductor layer are then etched, semiconductor film having increased crystallinity can be obtained.

Doping of a small amount of an impurity element (boron or phosphorous) may also be performed after forming the semiconductor layers 109 to 111 in order to control the TFT threshold value.

Doping of impurity elements is performed using resist masks 112a to 112c, and impurity elements imparting n-type (hereinafter referred to as n-type impurity elements) are doped into the region that become a semiconductor layer of n-channel TFT in later. A periodic table group 15 element, typically, phosphor (P) or arsenic (As) may be used as an impurity element to give the n-type. Herein, phosphor (P) is employed. Impurity elements imparting p-type (hereinafter referred to as p-type impurity elements) that is a periodic table group 13 element, typically, boron (B) or gallium (Ga) are doped into the region that become a semiconductor layer of p-channel TFT in later.

As mentioned above, the high density impurity regions 113 to 115 contained n-type impurity elements and p-type impurity element at a concentration range from $1\times10^{18}$ to $1\times10^{20}$/cm$^3$ (FIG. 4C). When the n-type impurity elements are doped, it is preferable that the region that become p-channel TFT in later is covered by masks not to add the n-type impurity elements. In the case that the n-type impurity elements are added to the region that become p-channel TFT, p-type impurity elements having concentrations that is enough to reverse into p-type should be added. As with the above, in the case that the p-type impurity elements are added, it is preferable that the semiconductor layer that become an n-channel TFT later is covered by masks (FIG. 4C).

Though not shown in figures, if necessary, the semiconductor region containing low density impurity elements in the semiconductor layer using masks may be formed. For example, the selected semiconductor layer is exposed by using resist masks. The dosage is set from $1\times10^{13}$ to $5\times10^{14}$/cm$^2$, and doping is performed at an acceleration voltage of 5 to 80 keV. A periodic table group 15 element, typically phosphorous (P) or arsenic (As) is doped. Thus, the low density impurity region can be formed in the selected region of the semiconductor layer. The n-type conductivity imparting impurity element is added to the low density impurity regions at a concentration range of $1\times10^{18}$ to $1\times10^{20}$ cm/$^3$.

Although the driver circuit is formed by both n-channel TFT and p-channel TFT in this embodiment, all driver circuit can be formed by only n-channel TFT or p-channel TFT.

The gate insulating film 116 is formed to cover the semiconductor layers 109 to 111. The gate insulating film 116 is formed by the insulating film contained silicon to have a thickness of 20 to 150 nm by LPCVD method, plasma CVD method, or sputtering method. In this embodiment, the oxynitride silicon film (composition ratio: Si=32%, O=59%, N=7%, and H=2%) is formed to have a thickness of 80 nm by plasma CVD method. Of course, the gate insulating film is no limited to the oxynitride silicon film. An insulating film contain another silicon may be used.

For example, when using a silicon oxide film, it can be formed by plasma CVD with a mixture of TEOS (tetraethyl orthosilicate) and O$_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C., of the silicon oxide film thus formed.

Consequently, the insulating film 140 is formed to have a thickness as same as the gate electrode that is formed later. The insulating film 140 is formed by an insulating film contained silicon, for example, the silicon oxide film, oxynitride silicon, and the like, by known method such as CVD method or sputtering method.

Next, on the insulating film 140, an opening portion that the gate electrode formed at later step is formed in its inside is formed.

In this embodiment, a silicon oxide film is adopted to the insulating film 140. The opening portion is formed by wet etching using etchant containing fluoride. When the wet etching is performed, the gate insulating film made from silicon oxynitride film is used as an etching stopper by utilizing the difference of the etching rate.

After the contact hole is formed at the bottom of the opening portion that connects the gate electrode and the gate wiring 102, the conductive film having a property of the heat resistance to have a thickness of 100 to 500 nm. In this embodiment, the W film is formed to have a thickness of 400 nm by the sputtering method with a W target. The W film may be formed by a thermal CVD method using tungsten hexafluoride (WF$_6$). The material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a crystalline silicon film doped with an impurity element such as phosphorus, may be used. Further, an AgPdCu alloy may be used. In this embodiment, though conductive film is formed to have a single layer structure, it may be a laminate structure that has two or more layers.

Next, masks (not illustrated) made of resist are formed using a photolithography method, and a first etching process is performed in order to form gate electrodes. In this embodiment, as the first etching conditions, an ICP (inductively coupled plasma) etching method is used, a gas mixture of CF$_4$, Cl$_2$ and O$_2$ is used as an etching gas, the gas flow rate is set to 25/25/10 sccm, and plasma is generated by applying a 500 W RF (13.56 MHZ) power to a coil shape electrode under 1 Pa. A 150 W RF (13.56 MHZ) power is also applied to the substrate side (test piece stage) to effectively apply a negative self-bias voltage. The gate electrodes 117 to 119 are formed in inside of the insulating film 140.

In this embodiment, since the impurity elements are doped into the semiconductor layer before forming the gate electrode, the region containing impurity elements can not be formed in a self-aligning manner to the gate electrode. It is possible that difference due to the gate electrode is flattened and the region containing impurity elements is formed in a self-aligning manner to the gate electrode. Specifically, the opening portion can be provided at the opening portion according to FIGS. 18A to 18C. Accordingly, since the insulating film 140 is removed, the impurity elements are doped into the semiconductor layer after formation of the gate electrode, thereby the impurities implantation region may be formed in a self-aligning manner.

Moreover, in this embodiment, although the insulating film 140 is formed after the formation of the gate insulating film 116, the gate insulating film 116 may be formed after forming a opening in the insulating film 140. This method is effective when forming an impurities implantation region in a self-aligning manner according to FIGS. 18A to 18C when forming the gate insulating film 116 and the insulating film 140 with a same kind film, for example, an oxidization silicon film.

Subsequently, the first interlayer insulating film 120a which covers gate electrodes 117 to 119 are formed. The first interlayer insulating film 120a is formed using an insulating film containing silicon to have a thickness of 50 to 200 nm, using the CVD method or the sputtering method. In this embodiment, the silicon oxynitride film having 50 nm in thickness is formed by the plasma CVD method. Of course, the first interlayer insulating film 120a is not limited to an silicon oxynitride film, and may use the insulating film containing other silicon as a single layer or laminate structure.

Heat treatment is performed next, recovering crystallinity of the semiconductor layers, and performing activation of the impurity elements added to the respective semiconductor layers. Thermal annealing using an annealing furnace is performed for the heat treatment process. Thermal annealing may be performed at a temperature of 400 to 1000° C. in a nitrogen atmosphere having an oxygen concentration equal to or less than 1 ppm, preferably equal to or less than 0.1 ppm. Activation process is performed by heat treatment for 4 hours at 950° C. in Embodiment 1. Note that, in addition to thermal annealing, laser annealing using a laser such as a YAG laser, and rapid thermal annealing (RTA) can also be performed. Further, the heat treatment process may be performed before that the first interlayer insulating film is formed. If the wiring material is weak against heat, it is preferable to perform the heat treatment after the first interlayer insulating film is formed to protect the wirings as Embodiment 1.

Hydrogenation processing can be performed if heat treatment is performed (at a temperature of 300 to 550° C. for 1 to 12 hours). This process is one of terminating dangling bonds in the semiconductor layers by hydrogen contained in the first interlayer insulating film 120a. The semiconductor layers can also be hydrogenated, of course, irrespective of the presence of the first interlayer insulating film. As another means for hydrogenation, plasma hydrogenation (using hydrogen excited by a plasma) or heat treatment for 1 to 12 hours at 300 to 450° C. within an atmosphere containing hydrogen of 3 to 100% may also be performed.

The second interlayer insulating film 120b consisted of the insulating material is formed on the first interlayer insulating film 120a. The insulating film containing silicon such as the oxide silicon film or the oxynitride silicon film is formed by using a known CVD method or sputtering method. In this embodiment, the oxide silicon film is formed as the second interlayer insulating film 120b. The third opening portion 121 is formed on the second interlayer insulating film 120b by etching successively, furthermore, a contact hole reaching semiconductor layers 109 to 111 is formed on the bottom of the third opening portion 121. In this embodiment, although the first interlayer insulating film 120a and the second interlayer insulating film 120b are formed separately, the films may be formed together by the same material. In that case, the formation of the opening portion may be controlled by the density of etchant and the etching time.

Subsequently, the wirings 122 to 126 to connect each TFT electrically are formed to reach the semiconductor layers 109 to 111 in the third opening portion 121. The third opening portion 121 is formed by etching. In the case that the wet etching is used, the formation of the third opening portion 121 may be adjusted by the density of etchant or processing time of etching. When the first interlayer insulating film 120a and the second interlayer insulating film 120b are formed by the material that has large selective ratio to the etchant, and the thickness of the second insulating film 120b is formed to have a thickness of desired depth of the third opening portion, the first interlayer insulating film 120a functions as an etching stopper, thereby the depth direction of the opening portion is easy to control. In addition, dry etching may also be used to form the opening.

As described above, the depth of the opening portion 121 formed at the second interlayer insulating film 120b and the thickness of the wirings 122 to 126 are about the same (FIG. 5A).

The third interlayer insulating film 127 is formed on the second interlayer insulating film 120b and the wirings 122 to 126. The third interlayer insulating film 127 may be formed by using the insulating material containing silicon such as silicon oxide film and silicon oxynitride film by known CVD method and sputtering as the second interlayer insulating film 120b. Since the wirings 122 to 126 are formed inside of the opening portion formed on the second interlayer insulating film 120b, the third interlayer insulating film 127 may be formed having a flat surface without being influenced of irregularities due to wirings.

Then, the fourth opening portion 128 is formed in the third interlayer insulating film 127, and the upper portion light shielding film 129 is formed into the fourth opening portion 128 (FIG. 5B). The upper portion light shielding film 129 is formed in the opening portion 128 that is formed in the third interlayer insulating film 127, and may be formed of an element selected from the group consisting of Al, Ti, W, and Cr or an alloy material containing the above element as its main constituent. In addition, the upper portion light shielding film 129 is provided to be mesh to shield the light except the opening portion (region which penetrates light and contributes to a display) of a pixel. Moreover, the light shielding film may be formed in the upper portion of the driver circuit. In addition, the wiring for connecting n-channel type TFT and p-channel type TFT of a driver circuit may be used by using the electric conductive film which forms the upper portion light shielding film.

Then, the fourth interlayer insulating film 130 that covers the third interlayer insulating film 127 and the light shielding film 129 is formed. The fourth interlayer insulating film 130 by the insulating film (for example, a silicon oxide film, a silicon oxynitride film, and the like) which contain silicon using known CVD method or the sputtering method as well as other interlayer insulating film.

Subsequently, an opening portion 131 is formed in the fourth interlayer insulating film 130. An opening portion 131 may be formed by etching as the opening portion formed in other interlayer insulating films. Then, the contact hole which reaches the wiring (drain wiring) 126 of the switching element (pixel TFT) of a pixel is formed in the bottom of a opening portion 131.

Then, the pixel electrode 132 that reaches wiring 126 is formed in the opening portion 131. The pixel electrode 132 may be formed to have a thickness of 100 nm using a transparent electric conductive film (ITO). Moreover, in a pixel electrode formation process, the extraction electrode 133 may be formed in a driver circuit. In the case that the extraction electrode 133 is formed, the opening portion is formed, and the contact hole that reaches the wiring 122 continuously, thereby the extraction electrode 133 may be formed (FIG. 6).

Even if the planarizing process by CMP method or SOG film formation is not added to an active matrix substrate that has irregularities (level difference) on the order of the size of wirings and thickness of electrodes due to the wirings and electrodes, the irregularities of the interlayer insulating film can be made small.

The active matrix substrate by which the driver circuit 204 which consists of a CMOS circuit of n-channel TFT 201 and p-channel TFT 202, and the pixel portion 205 that has a pixel TFT 203 are formed on the same substrate is completed as mentioned above.

By applying the present invention, the active matrix substrate that has small irregularities (level difference) on surface thereof can be realized using existing devices without introducing new devices to planarize the interlayer insulating film such as planarization by a polishing process by CMP method or by SOG film formation.

Since rubbing processing can be performed uniformly in a liquid crystal display by applying this invention, the alignment disorder of liquid crystal does not occur, and a high quality display can be performed. Furthermore, since it becomes unnecessary to form the light shielding film prepared in order to prevent the deterioration of image quality by alignment disorder, the opening ratio can be higher, luminosity can improve and display ability can be raised further.

Moreover, if the present invention is applied, the substrate which can be adapted in the polish technology by the CMP method is used, and even if it is the case where the polish technology by the CMP method is introduced, the load to CMP equipment can be reduced.

(Embodiment 2)

In this embodiment, an example of steps that forms TFT on a plastic substrate by applying the present invention is described.

First, a base insulating film 501 is formed on a substrate 500. A plastic substrate is used as the substrate 500. The plastic substrate made of, for example, polyimide, acrylic, PET (polyethylene terephthalate), PC (polycarbonate), PAR (polyallylate), PEEK (polyether etherketone), PES (polyether sulfone), PEN (polyether nitrile), nylon, PSF (polysulfone), PEI (polyetherimide), PBT (polybutylene terephthalate), or the like can be used.

The base insulating film 501 is formed by a sputtering method or plasma CVD method. When these methods are used, it is preferably formed at a substrate temperature of a room temperature to 300° C. The base insulating film 501 is formed to have a laminate structure that has large selection ratio to the etchant, and the first layer 501a is formed to have a function of an etching stopper, thereby the depth direction of the opening portion is easy to control when the first opening portion 502 is formed.

Consequently, the first opening portion 502 is formed in the second layer, the base insulating film 501b. The first opening portion 502 may be formed by using etching treatment.

Figure 7A:
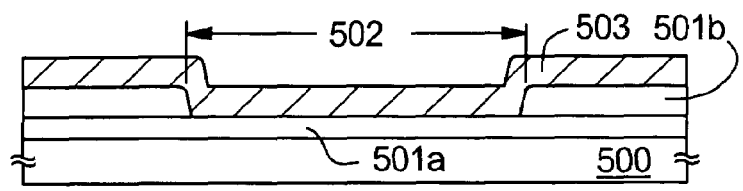
FIGS. 7A to 7G show an example of an embodiment of the invention.

Next, an amorphous silicon film is formed on the base insulating film 501 having the first opening portion 502 (FIG. 7A). The amorphous silicon film may be formed by known techniques as follows; sputtering method, a plasma CVD method, a LPCVD method, a vacuum evaporation method, a photo CVD method, or the like. The masks are formed on the amorphous silicon film in the opening portion to remove unnecessary portion by etching treatment. Thereby the semiconductor layer 503 can be formed in the first opening portion. The depth of the first opening portion 502 and the thickness of the semiconductor film 503 are about the same.

The semiconductor layer 503 is crystallized by the crystallizing method of the laser light irradiation. Note that, in the case of the crystallization by laser light irradiation, although it is preferable that the amount of hydrogen included in the semiconductor layer 503 before the irradiation is made to be 5 atomic % or less, high temperature heat treatment is impossible if a plastic film is formed. Thus, deposition conditions that suppress the hydrogen density low at the stage shortly after the deposition of amorphous silicon film may be used.

Further, gaseous state laser such as excimer laser, solid state laser such as $YVO_4$ laser or YAG laser, or semiconductor laser may be used for the crystallization of the semiconductor film. The laser emission may be continuous emission or pulse emission, and the shape of the laser beam may be linear, rectangular, circular, or elliptical. The wavelength used may be suitably selected from any of the fundamental harmonic, the second harmonic, and the third harmonic. Furthermore, vertical, horizontal, or diagonal direction scanning may be used as a method of scanning, and in addition, round trip scanning may also be performed. In addition, the crystallizing process steps may be carried out before that the semiconductor film 503 is etched to form the semiconductor layer.

Figure 7B:
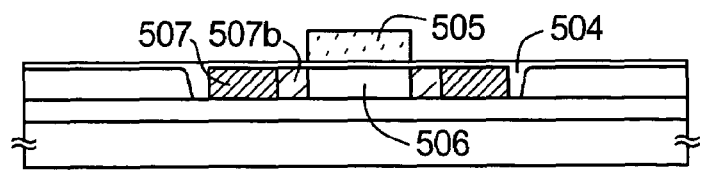

The gate insulating film 504 is formed to have a thickness of 50 to 150 nm by insulating films containing silicon (for example, the silicon oxide film, the silicon oxynitride film, silicon nitride oxide film, or the like) using known methods such as CVD method, sputtering method and the like. Continuously, the mask 505 (hereinafter, referred to as the channel protective region) not to add impurity elements to the region that becomes later the channel forming region of the semiconductor layer. The high density impurity elements regions 507 (that become a source region and the drain region layer) and the channel forming region 506 are formed by adding impurity elements to the semiconductor layer. If necessary, the region including the low density impurity element (referred to as a light doped drain region: LDD region) 507b may be formed. As impurity elements, n-type imparting element (typically, phosphorus) and p-type imparting element (typically, boron) may be added (FIG. 7B).

Figure 7C:
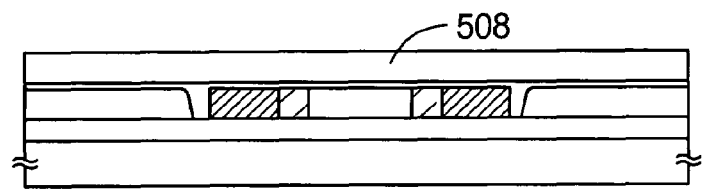

Subsequently, the channel protective film 505 is removed to form the insulating film 508 (FIG. 7C). The insulating film 508 is formed by insulating films containing silicon (for example, the silicon oxide film, the silicon oxynitride film, the silicon nitride oxide film, and the like) using known method such as CVD method or sputtering method to have a thickness of 100 to 500 nm. Thereafter, the second opening portion 509 is formed on the insulating film 508. Note that, it is necessary not to etch the gate insulating film 504 when the second opening portion 509 is formed. Or it is necessary that the gate insulating film 504 and the insulating film 508 are formed by the material that has large etching ratio to the etchant.

Figure 7D:
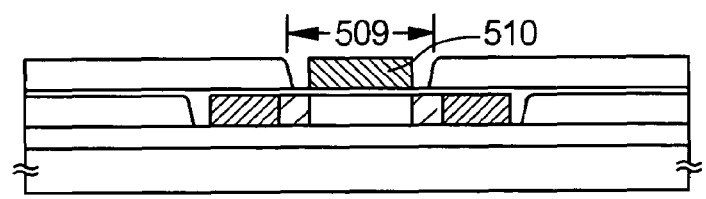

Next, to form the gate electrode, the conductive film is formed by elements selected from the group consisting of TA, W, Ti, Mo, Cu, Cr, and Nd or an alloy material containing the above element as its main constituent. On the second opening portion 509, the unnecessary region is then etched by forming masks on the conductive films to form the gate electrode 510 in the second opening portion 509. Further, the depth of the second opening portion 509 and the thickness of the gate electrode 510 are about the same (FIG. 7D).

Figure 7E:
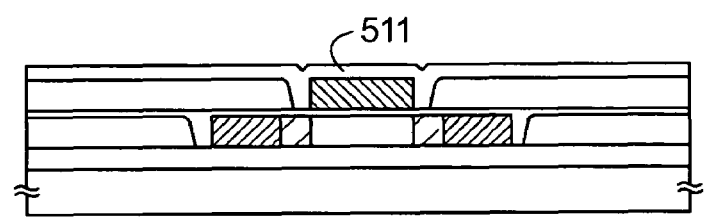

The first interlayer insulating film 511 is formed next, and the heat treatment at a temperature of 150 to 300° C. and the activation of the regions that become a source region and the drain region that is added the high density of impurity elements by the laser light irradiation are performed (FIG. 7E).

Figure 7F:
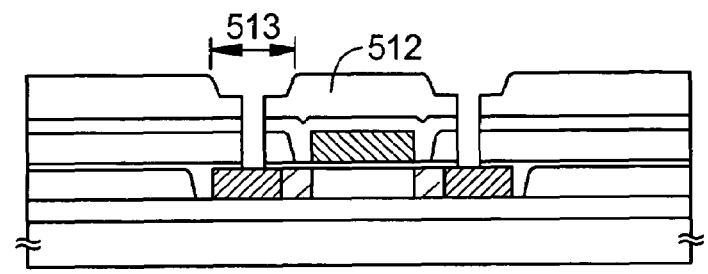
Figure 7G:
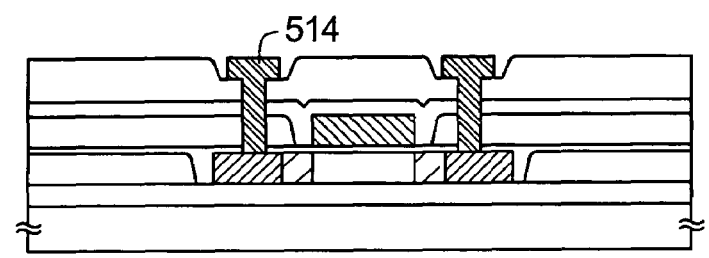

The second interlayer insulating film 512 is formed and the third opening portion 513 is formed in the second interlayer insulating film 512. The second interlayer insulating film is formed by the insulating film containing silicon such as the silicon oxide film, the silicon nitride film, and the silicon oxynitride film to have a thickness of 500 to 1000 nm by using known CVD method and the sputtering method. The contact hole that reaches to the semiconductor layer 503 is formed at the bottom of the third opening portion 513 (FIG. 7F).

The wiring 514 that connects each TFT electrically in the third opening portion 513 is formed. The depth of the third opening portion 513 and the thickness of the wiring 514 is about the same.

The hydrogenation process is performed to improve the TFT characteristics. As the hydrogenation, the heat treatment at the temperature of 300 to 350° C. for 1 hour and the low temperature plasma hydrogenation are performed.

As described above, TFTs can be formed on the plastic substrate by applying the present invention at the process temperature of 400° C. or less.

In this embodiment, although the injection of impurity elements is performed before the formation of the gate electrode, it may also possible to be performed after the formation of the gate electrode as explained in Embodiment 1. As in the explanation in Embodiment 1, the gate insulating film 504 may be formed after the opening portion is formed in the insulating film 510. Also as in the explanation in Embodiment 1, the formation of the insulating film 508 may by omitted by planarization adjusting the thickness of the base film 501b is performed.

The present invention can be applied without selecting the kinds of substrates, and the semiconductor device that has planarized surface without performing the planarization such as the polishing method by CMP method and by SOG film formation may be formed.

(Embodiment 3)

In this embodiment, the steps applied to the present invention to manufacture the bottom type TFT is described with reference to FIGS. 8 to 9.

First, the first opening portion 601 is formed on the substrate 600. Next, although not illustrated in FIG. 8A, the base insulating film is formed to improve the TFT electric characteristics preventing diffusion of impurity elements from the substrate. As the material for the base insulating film, the silicon oxide film, the silicon nitride film, the silicon oxynitride film, or lamination films composed of these films are used.

Figure 8A:
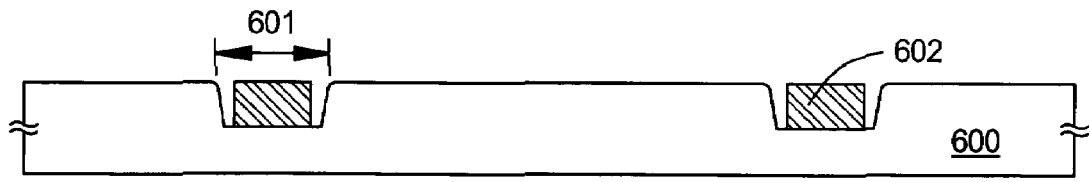
FIGS. 8A to 8E show an example of an embodiment of the invention.

Gate wirings (including gate electrodes) 602 are formed next from a single layer structure or a laminate structure in the first opening portion 601. For example, a high melting point metal material such as Ta (tantalum), Mo (molybdenum), Ti (titanium), W (tungsten), chromium (Cr) may be used, as may a silicide compound of these metal materials and silicon. In addition, a material such as polysilicon having n-type or p-type conductivity, or a material layer having a low resistance metal material such as Cu (copper) or Al (aluminum) as its main constituent, may be used as the materials for gate wirings 602. The gate wiring 602 having at least one layer among these layers is formed to have a thickness from 10 to 1000 nm, preferably in the range of 30 to 300 nm, using a method such as normal pressure CVD, plasma CVD, low pressure thermal CVD, evaporation, sputtering, or the gate wirings 602 is formed by etching using masks (not illustrated) on the first opening portion 601. The depth of the first opening portion 601 and the thickness of the gate wiring 602 are about the same (FIG. 8A).

Figure 8B:
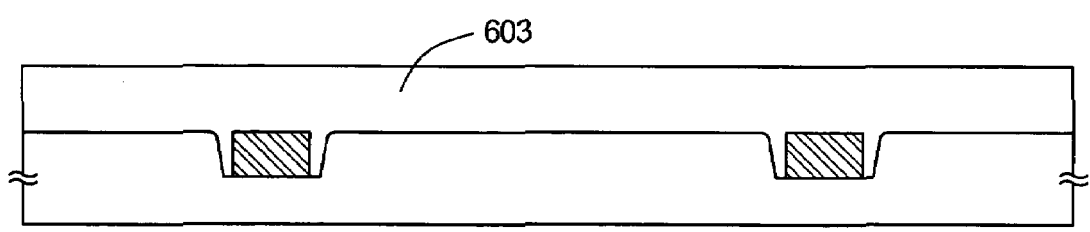
Figure 8C:
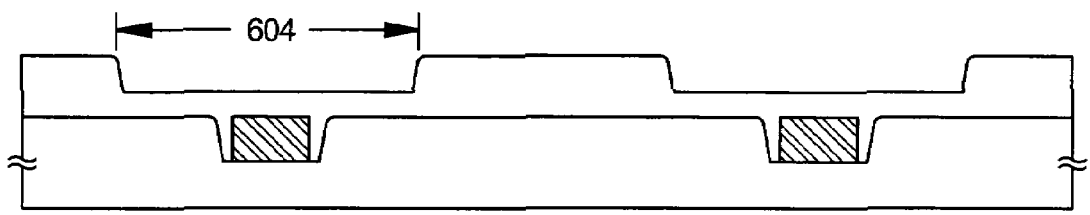

The gate insulating film 603 is formed next (FIG. 8B). The gate insulating film is formed by the silicon oxide film, the silicon nitride film, the silicon oxynitride film, or the lamination layer composed of these layers, and formed to have a thickness of 100 to 400 nm. The base insulating film 603 can be formed by thermal CVD method, plasma CVD method, the LPCVD method, evaporation method, and the sputtering method. The second opening portion 604 is formed on the gate insulating film 603 continuously (FIG. 8C). For the formation of the opening portion, known etching method may be used as shown in Embodiment Mode or Embodiment 1.

Figure 8D:
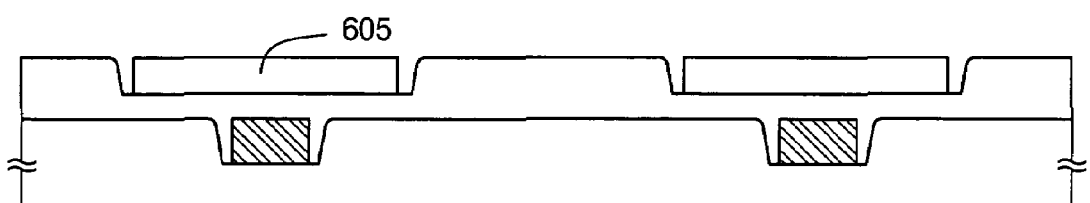

An amorphous semiconductor film is formed to form the semiconductor layer in the second opening portion 604. An amorphous semiconductor film is formed by any films that are composed of silicon film or silicon germanium film (SixGe-x: 0<x<1). The semiconductor film is formed by using the known thermal CVD method, plasma CVD method, low pressure CVD method, evaporation method, sputtering method, and the like. The crystallization of the semiconductor film is performed by a known method, and masks are formed (not illustrated) to the semiconductor film in the second opening portion 604. Unnecessary regions are removed to form the semiconductor layer 605. In addition, crystallization process may be performed after the semiconductor film 605 is formed. The depth of the second opening portion 604 and the thickness of the semiconductor layer 605 are about the same (FIG. 8D).

Figure 8E:
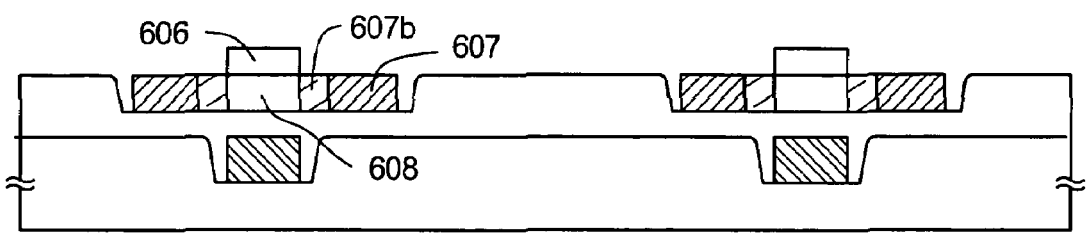

Continuously, the insulating film or the mask 606 (hereinafter, referred to as the channel protective region) not to add impurity elements to the region that becomes later the channel forming region of the semiconductor layer are formed on the semiconductor layer 605. The high density impurity elements regions 607 (that become the source region and the drain region) and the channel forming region 608 are formed by adding impurity elements to the semiconductor layer 605. If necessary, the region including the low density impurity element (referred to as a light doped drain region: LDD region) 607b may be formed. As impurity elements, n-type imparting element (typically, phosphorus) and p-type imparting element (typically, boron) may be added (FIG. 8E).

An activation process of the impurity element doped with the semiconductor layer is performed. For the activation process, the heat treatment using the furnace or the RTA device, or the laser light radiation process may be performed.

Figure 9A:
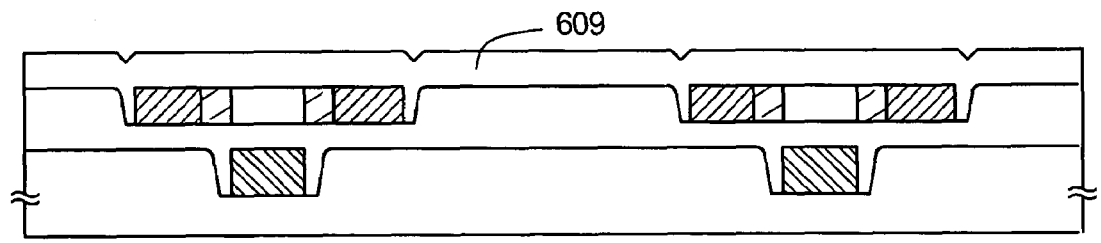
FIGS. 9A to 9C show an example of the invention.

The first interlayer insulating film 609 is formed. The first interlayer insulating film 609 is formed to have a thickness of 100 to 400 nm by the silicon oxide film, the silicon nitride film, the silicon oxynitride film, or the lamination film composed of these films by using known thermal CVD method, plasma CVD method, LPCVD method, evaporation method, sputtering method, and the like (FIG. 9A).

The second interlayer insulating film 610 is formed. The second interlayer insulating film 610 is formed to have a thickness of 500 to 1000 nm by the silicon oxide film, the silicon nitride film, the silicon oxynitride film, or the lamination film composed of these films by using known thermal CVD method, plasma CVD method, LPCVD method, evaporation method, sputtering method, and the like.

Figure 9B:
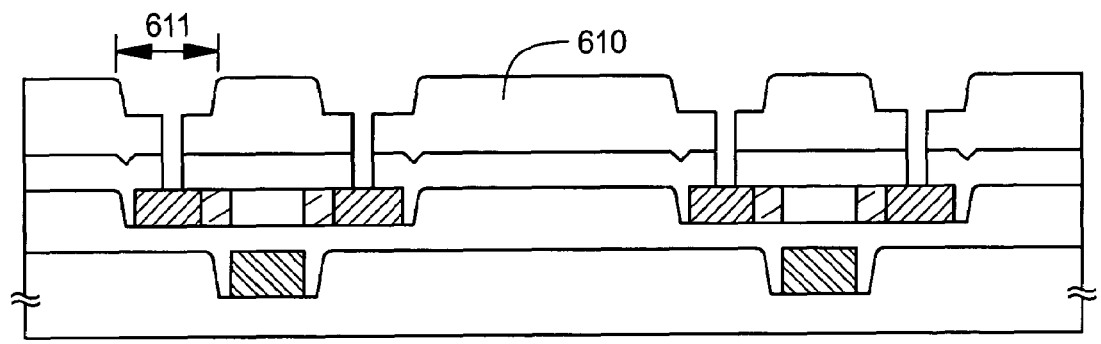

The third opening portion 611 is formed on the second interlayer insulating film 610. The formation of the opening portion is used a known etching method as shown in Embodiment Mode or Embodiment 1 (FIG. 9B).

The contact hole that reaches to the semiconductor layer 605 at the bottom of the third opening portion 611, and the wiring 612 to connect electrically each TFT in the third opening portion 611. The wiring 612 may be formed by using Al, TiMo, W, or conductive materials composed of these elements to have the thickness of 300 to 500 nm.

Figure 9C:
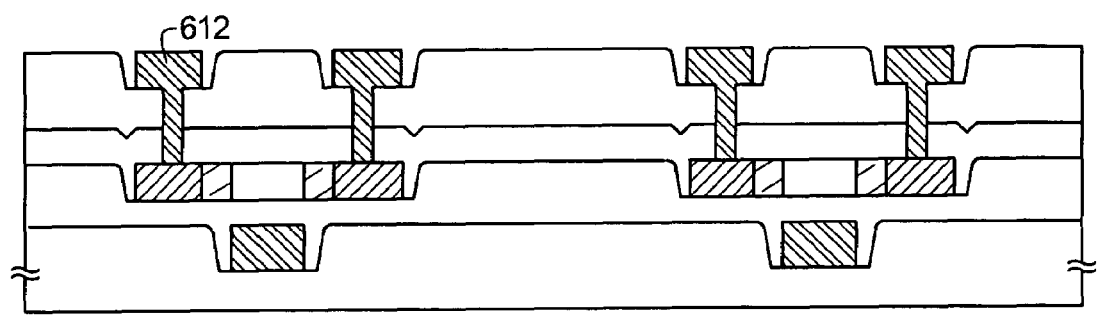

The masks are formed on the conductive film made of the above-mentioned conductive materials, and etching is performed to form the wiring 612. Thus, the depth of the third opening portion 611 and the thickness of the wiring 612 are about the same (FIG. 9C).

As mentioned above, the surface of the top layer of the insulating film can be planarized by forming layers in the opening portion that is formed on the insulating films without using planarization such as CMP polishing process or SOG film deposition.

Heat treatment such as hydrogenation is not especially limited, it may appropriately performed by the operator.

Therefore, the present invention may be applied irrespective of shape of TFT. Thereby, the semiconductor device can be formed that has planarized surface without using planarization such as CMP polishing process or SOG film deposition.

The semiconductor device manufactured by the present invention can be preferably used to not only the liquid crystal display device but also the light emitting device that has elements in which a light emitting material is sandwiched between electrodes.

(Embodiment 4)

The invention can be applied to not only the liquid crystal display apparatus but also a luminescent apparatus having an element having a luminescent material sandwitched between electrodes. The example is shown in FIG. 10.

Figure 10:
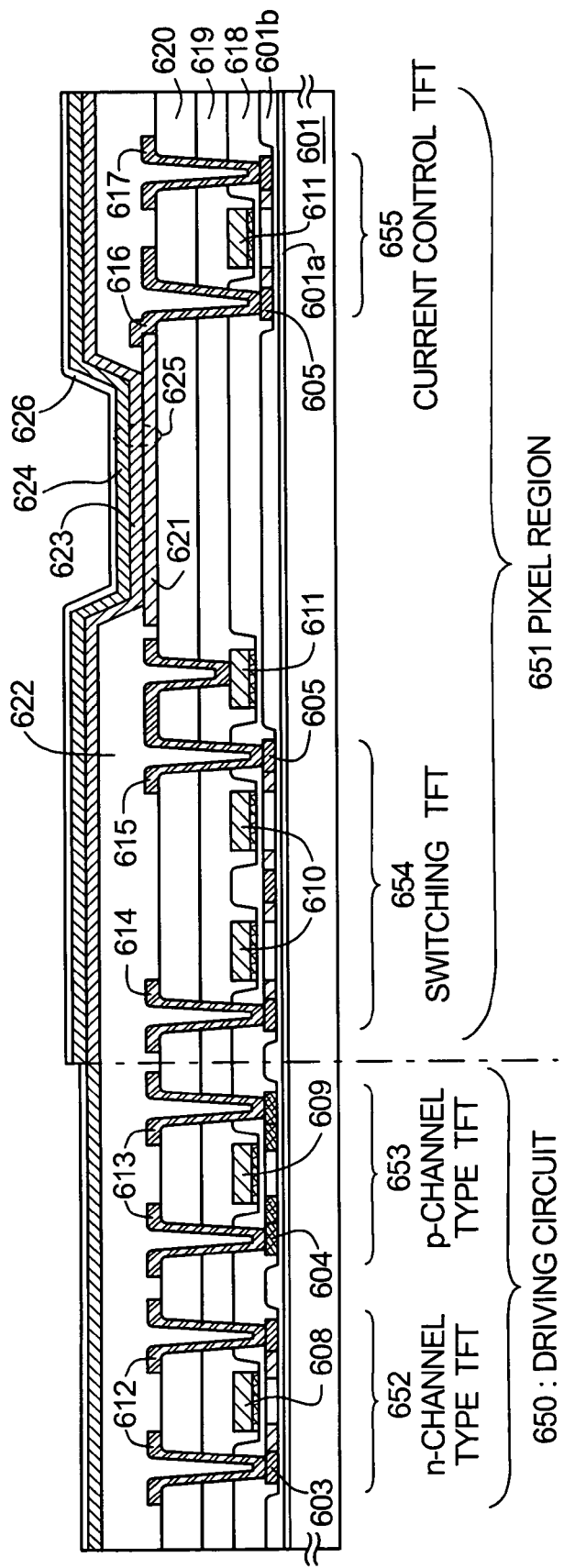
FIG. 10 shows an example of an embodiment of the invention.

FIG. 10 is an example showing a structure of an active-matrix driving of luminescent apparatus. An n-channel type of TFT 652 and a p-channel type of TFT 653 of a driving circuit portion 650, and a switching TFT 654 and a current control TFT 655 of a pixel portion 651 shown in FIG. 10 are produced by applying the invention in the same way as the example 2. In the embodiment, the conductive layer of the gate electrode is formed by a double-layered film.

In an upper layer of the gate electrodes 608 to 611, a first interlayer dielectric film 618 made of silicon nitride and silicon nitride-oxide is formed. Then, a second interlayer dielectric film 619 is formed. The second interlayer dielectric film 619 has a structure in which an organic resin film such as acryl is built up on an inorganic dielectric film made of the same material as the first interlayer dielectric film 618.

A third interlayer dielectric film 620 made of the inorganic dielectric material such as silicon nitride is formed on the second interlayer dielectric film 619. The organic resin material forming the second interlayer dielectric film has hygroscopicity occluding $H_2O$. When $H_2O$ is discharged, oxygen is supplied to the organic compound to cause deterioration of an organic luminescent element, so that in order to prevent the occlusion and discharge of $H_2O$, the third interlayer dielectric film 620 made of silicon nitride or silicon nitride-oxide is formed on the second interlayer dielectric film 619. The first interlayer dielectric film 619 prevents $H_2O$ from penetrating into TFT.

An anode electrode 621 made of a transparently conductive material such as ITO (Indium Tin Oxide) is formed on the third interlayer dielectric film 620, an aperture portion is formed in the third interlayer dielectric film 620, a contact hole reaching a semiconductor layer is formed on a bottom surface of the aperture, and wirings 612 to 617 connecting electrically each TFT are formed.

A silicon nitride film is formed as a dielectric film coating over the wirings 612 to 617 and the anode electrode 621 by the spattering method. The silicon nitride film in an area where an organic luminescent element 625 is formed is removed to form a bank 622. The structure of the luminescent apparatus includes an organic compound layer 623 having a hole injection layer, a hole transport layer, and a luminous layer and a cathode electrode 624 made of a alkali metal or a alkaline-earth metal such as MgAg or LiF. A detailed structure of the organic compound layer 623 shall be optional.

The cathode electrode 624 is made of a material having a small work function such as Mg, Li or Ca. The electrode is preferably made of MgAg (a material mixed by a ratio of Mg:Ag=10:1). A MgAgAl electrode, a LiAl electrode, and a LiFAl electrode are applicable to the cathode electrode. A fourth interlayer dielectric film 626 made of silicon nitride, carbon nitride or a DLC film (Diamond Like Carbon) is formed on the upper layer. The thickness of the fourth interlayer dielectric film 626 is in a range from 2 to 30 nm, preferably 5 to 10 nm. The DLC film can be formed by the plasma CVD method at temperatures not more than 100° C. An inner stress of the DLC film can be released by mixing traces of oxygen and nitrogen and used as the protection film. It is known that the DLC film has high gas barrier characteristics against oxygen, CO, $CO_2$ and $H_2O$. It is desirable that after the cathode electrode 624 is formed, the fourth interlayer dielectric film 626 is formed continuously without exposing to the air. The reason is that an interfacial state between the cathode electrode 624 and the organic compound layer 623 influences luminous efficiency of the organic luminescent element.

The driving circuit portion 650 includes the n-channel type of TFT 652 and the p-channel type of TFT 653, the wirings 612 and 613 are connected to the driving circuit portion 650. A shift register, a latch circuit, and a buffer circuit are formed by using these TFTs.

In the pixel portion 651, the data wiring 614 is connected to a source side of the switching TFT 654, the wiring 615 of a drain side of the switching TFT 654 is connected to the gate electrode 611 of the current control TFT 655. A source side of the current control TFT 655 is connected to the power supply wiring 617, the electrode 616 of a drain side of the current control TFT 655 is connected to the anode electrode 621.

In FIG. 10, the switching TFT 654 has a multi-gate structure, the low doped drain (LDD) overlapped with the gate electrode is provided in the current control TFT 655. Since the TFT made of polycrystal silicon has high operating speed, the deterioration such as hot carrier injection is easy to generate. For that reason, it is very effective that the TFTs having a different structure (the switching TFT having sufficiently low off current and the current control TFT having high resistance against the hot carrier injection) are formed according to a function in a pixel element, in order that the display apparatus having a high reliability and being able to display a good image (high operating performance) is produced.

AS shown in FIG. 10, on the lower layer side (substrate 601 side) of the semiconductor layer constituting the TFTs 654 and 655, an underlying dielectric film 602 is formed. The first interlayer dielectric film 618 is formed on the opposite side. On the other hand, the third interlayer dielectric film 620 is formed in the lower layer side of the organic luminescent element 625. The DLC film is formed as the fourth interlayer dielectric film 626 on the cathode electrode 624. In the alkali metal such as sodium most harmful to the TFTs 654 and 655, though a substrate 601 and the organic luminescent element 625 are thought as a pollution source, the alkali metal is blocked by surrounding with the underlying dielectric film 602 and the first interlayer dielectric film 618. Since oxygen and $H_2O$ is most harmful to the organic luminescent element 625, the third interlayer dielectric film 620 and the fourth interlayer dielectric film 626 are formed in order to block the oxygen and $H_2O$. The third interlayer dielectric film 620 and the fourth interlayer dielectric film 626 also have a function for blocking the alkali metal contained in the organic luminescent element 625.

In the organic luminescent apparatus having the structure shown in FIG. 10, an example of efficient production method may adopt a process in which the anode electrode 621 made of the transparently conductive film typified by ITO is deposited continuously by spattering method. The spattering method is suitable for forming silicon nitride film or silicon nitride-oxide film without causing remarkable damage to a surface of the second interlayer dielectric film 619 made of the organic dielectric film.

AS described above, the luminescent apparatus can be completed in a manner that the TFT formed by applying the invention and the organic luminescent element are combined to form the pixel portion. In the luminescent apparatus, the driving circuit can be also formed on the same substrate by using the TFT.

(Embodiment 5)

In the embodiment 5, referring to FIG. 11A to FIG. 13G, another example of formation of wiring portion of the invention described in the embodiments 1 to 4 will be explained. However, the embodiment is described by using the production process of the TFT of the embodiment 2 in FIG. 13A to 13G, it is not limited to the embodiment 2, the embodiment and the embodiment 1 to 3 are also applicable. Since the production process of the TFT of the embodiment 2 in FIG. 13A to 13G may follow the embodiment 2, the description will be abbreviated.

Figure 11A:
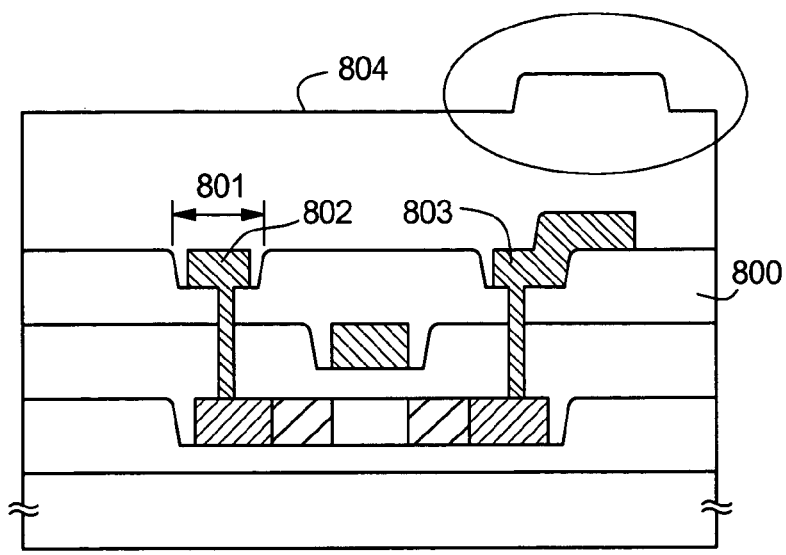
FIGS. 11A to 11D show an example of an embodiment of the invention.
Figure 12A:
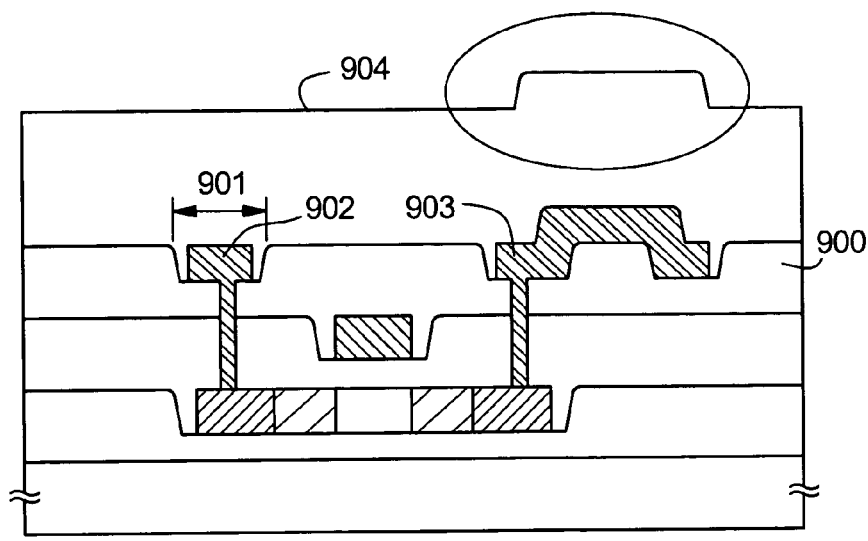
FIGS. 12A to 12D show an example of an embodiment of the invention.

According to the embodiment 3, an aperture portion is formed in a dielectric film, and a semiconductor layer or electrode is formed in the aperture, to form a semiconductor device with its surface smoothed as shown in FIG. 13A to FIG. 13F. Then, first interlayer dielectric films 800 and 900 are formed, and first aperture portions 801 and 901 are formed. Wirings 802, 803, 902, and 903 are formed. At this point, though the wirings 802 and 902 are formed in the first aperture portions 801 and 901, the wirings 803 and 903 are formed so that at least a part of the wirings 803 and 903 are protruded from the aperture portions 801 and 901 as shown in FIG. 11A or FIG. 12A.

Second interlayer dielectric films 804 and 904 coating over the first interlayer dielectric films 800 and 900 and the wirings 802, 803, 902, and 903 are formed. Surfaces of the second interlayer dielectric films 804 and 904 become a convex shape by influence of the wirings 803 and 904 as shown in a region surrounded by a circle in FIG. 11A or FIG. 12A.

Figure 11B:
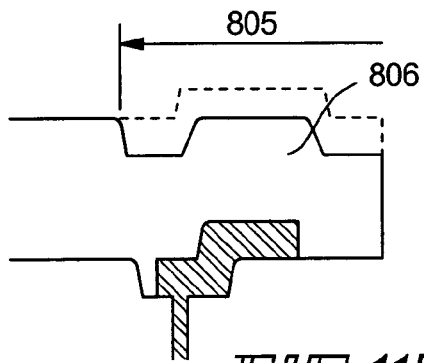
Figure 12B:
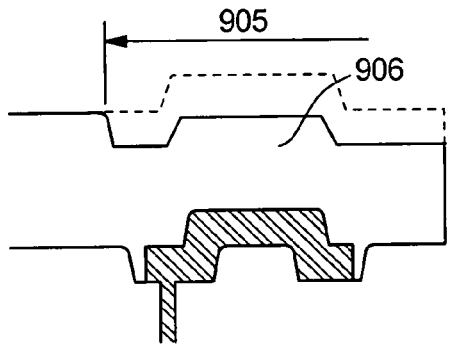

Second aperture portions 805 and 905 are formed in the second interlayer dielectric films 804 and 904 (FIG. 11B and FIG. 12B). Even though the second interlayer dielectric films 804 and 904 are etched to form the second aperture portions 805 and 905, convexities 806 and 906 formed by influence of the wirings 803 and 903 remain inside the second aperture portions 805 and 905.

Figure 11C:
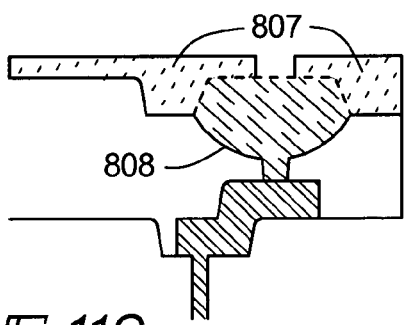
Figure 12C:
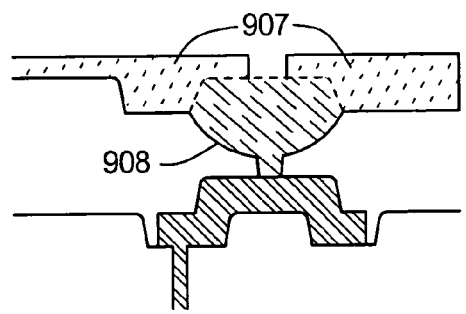

Then, the convexities 806 and 906 remaining inside the second aperture portions 805 and 905 are removed and the etching is done by using masks 807 and 907 in order to form a contact hole reaching to the wirings 803 and 903. First, by the wet etching, the etching corresponding to thicknesses of the convexities 806 and 906 is done. Because the wet etching is the isotropic etching, the etching in a direction parallel to the substrate (lateral direction) is also done with the same speed as the etching in a direction of depth. The convexities 806 and 906 are removed by the wet etching treatment. An anisotropic dry etching is done with the masks 807 and 907 remaining intact. The contact hole having the same diameter as the aperture portions of the masks 807 and 907 can be formed by the dry etching. Consequently, regions indicated by 808 and 908 in FIG. 11C or FIG. 12C are removed by the etching and the contact holes are formed.

Conductive layers are formed on the second aperture portions 805 and 905, on the second aperture portions 805 and 905 masks are formed on the conductive layers to remove unnecessary regions by etching, wirings 809 and 909 are formed.

Figure 11D:
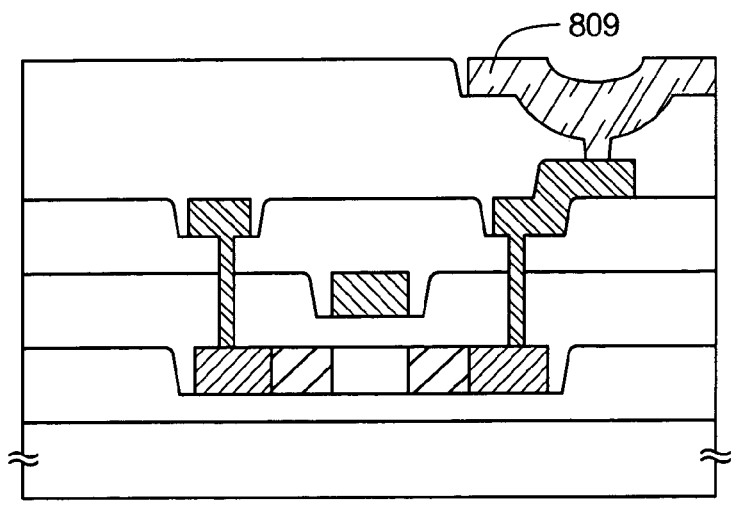
Figure 12D:
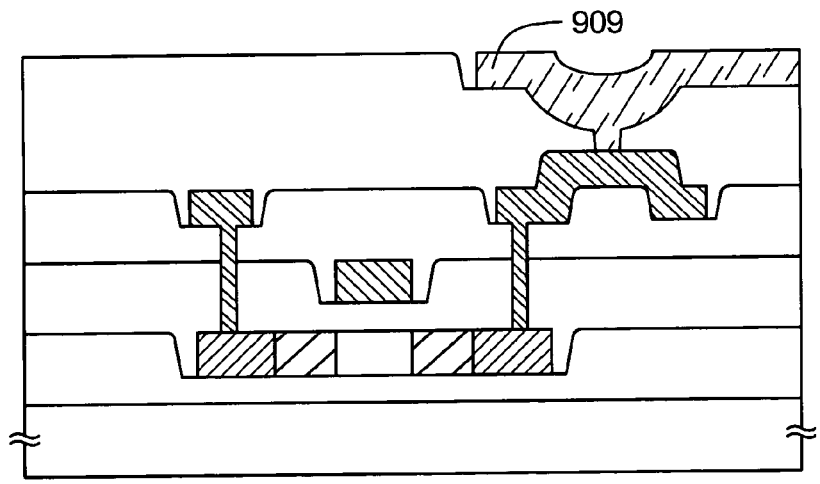
Figure 13A:
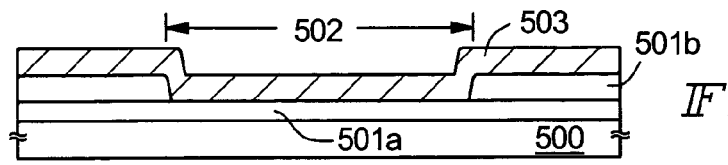
FIGS. 13A to 13G show an example of an embodiment of the invention.
Figure 13B:
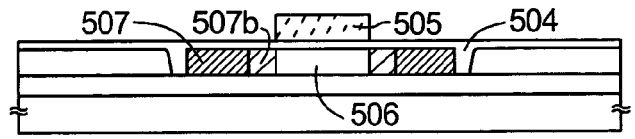
Figure 13C:
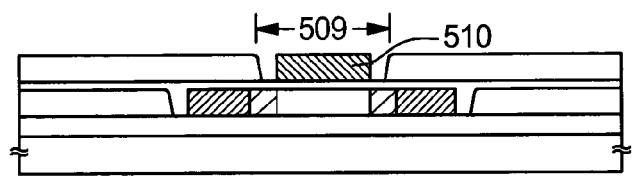
Figure 13D:
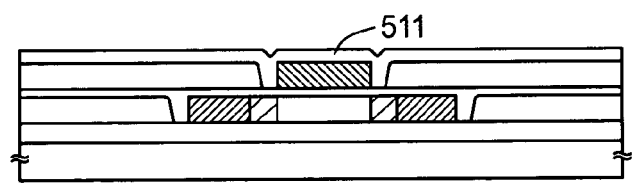
Figure 13E:
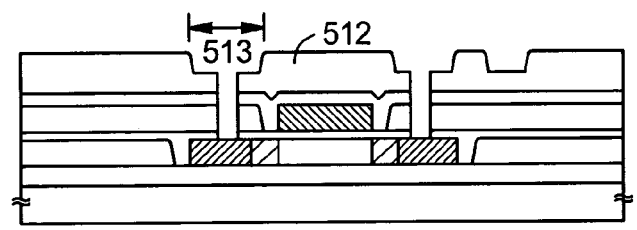
Figure 13F:
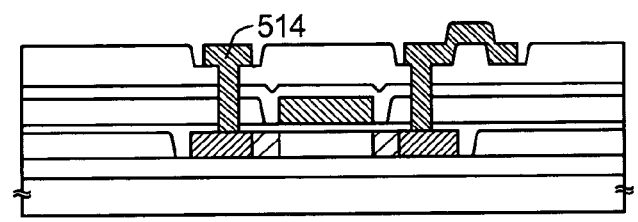
Figure 13G:
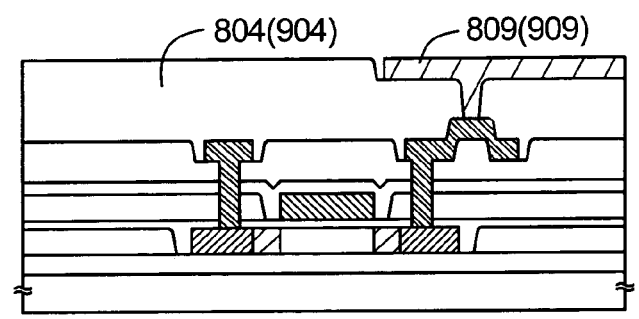

The wirings 803 and 903 are formed such that at least a part of the wirings 803 and 903 is respectively protruded from the aperture portions 801 and 901, so that the depth of the contact hole formed in the second interlayer dielectric films 804 and 904 can be made shallow by the film thickness of the protruded wirings and the aspect ratio of the contact hole can be reduced, which permits the process for forming the contact hole to be simplified. Furthermore, the semiconductor film with smoothing surface can be formed without the polishing treatment by the CMIP method or the smoothing treatment by formation of the SOG film (FIG. 11D, FIG. 12D, and FIG. 13G).

Usually, it is thought that the film thickness of the interlayer dielectric film tends to be formed thick in order to reduce the parasitic capacitance generated by, for example, the gate electrode and the interlayer dielectric film. However, for example, by thickening the film thickness of the interlayer dielectric film, it takes long time to make the contact hole for taking electric contact. There is a problem that, since the formed contact hole has the large aspect ratio, coverage is bad in the spattering deposition which is after used in forming wirings, eaves are formed at an upper portion of the contact hole, which causes the wirings not to be formed up to a bottom surface of the contact hole, resulting in the disconnection.

However, by applying the invention in which the wirings are formed continuously inside and outside the aperture portion as in the embodiment, since the invention is not the embedded wirings like damascene process, the film thickness of the interlayer dielectric film can be thinned in only a region where the contact hole is formed, and the contact hole having the small aspect ratio can be formed. Furthermore, the semiconductor film with smoothing surface can be formed without polishing treatment by the CMP method or the smoothing treatment by formation of the SOG film.

The embodiment can be applied by combining the embodiment and the embodiment 1 to 4.

(Embodiment 6)

The CMOS circuit and the pixel portion fabricated by implementing the present invention can be utilized for active matrix liquid crystal display device. Namely, the present invention can be implemented onto all of the electronic devices that incorporate such liquid crystal display devices as a display portion.

Following can be given as such electronic devices: video cameras; digital cameras; projectors (rear type or front type); head mounted displays (goggle type displays); personal computers; portable information terminals (mobile computers, portable telephones or electronic books etc.) etc. Examples of these are shown in FIGS. 14, 15 and 16.

FIG. 14A is a personal computer which comprises: a main body 2001; an image input section 2002; a display section 2003; and a key board 2004. FIG. 14B is a video camera which comprises: a main body 2101; a display section 2102; a voice input section 2103; operation switches 2104; a battery 2105 and an image receiving section 2106. FIG. 14C is a mobile computer which comprises: a main body 2201; a camera section 2202; an image receiving section 2203; operation switches 2204 and a display section 2205. The display device that is used as the display portion of the electronic devices is one example of the flat face type display device. In the case that the display device is a built-in driver circuit display device, the degree of location of the pixel portion and the driver circuit are different. Consequently, by applying the present invention, the surface can be planarized without performing polishing process by CMP method and SOG method.

FIG. 14D is a goggle type display which comprises: a main body 2301; a display portion 2302; and an arm portion 2303. The display device that is used to the display portion 2302 of the goggle type display is one example of the curved face type display device. FIG. 14E is a player using a recording medium which records a program (hereinafter referred to as a recording medium) which comprises: a main body 2401; a display portion 2402; a speaker portion 2403; a recording medium 2404; and operation switches 2405. This device uses DVD (digital versatile disc), CD, etc. for the recording medium, and can perform music appreciation, film appreciation, games and the use for Internet. FIG. 14F is a digital camera which comprises: a main body 2501; a display portion 2502; a view finder 2503; operation switches 2504; and an image receiving section (not shown in the figure). The display device that is used as the display portion 2402 of the player or the display portion 2502 of the digital camera is an example of the flat face type display device. Consequently, by applying the present invention, the surface can be planarized without performing polishing process by CMP method and SOG method, and micro-fabrication realizes high-definition and high-luminance display.

FIG. 15A is a front type projector which comprises: a projection system 2601; and a screen 2602.

FIG. 15B is a rear type projector which comprises: a main body 2701; a projection system 2702; a mirror 2703; and a screen 2704.

FIG. 15C is a diagram which shows an example of the structure of a projection system 2601 and 2702 in FIGS. 15A and 15B. Projection systems 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 15C.

FIG. 15D is a diagram showing an example of a structure of an optical light source system 2801 in FIG. 15C. In this embodiment the optical light source system 2801 comprises: a reflector 2811; a light source 2812; lens arrays 2813 and 2814; a polarizer conversion element 2815; and a collimator 2816. Note that the optical light source system shown in FIG. 15D is merely an example and the structure is not limited to this example. For instance, an operator may appropriately dispose an optical lens, a film which has a function to polarize light, a film which adjusts a phase difference or an IR film, etc.

Note that the projectors shown FIG. 15A to 15D are the cases of using a transmission type electro-optical devices, and applicable examples of a reflection type liquid crystal display device are not shown.

Figure 16A:
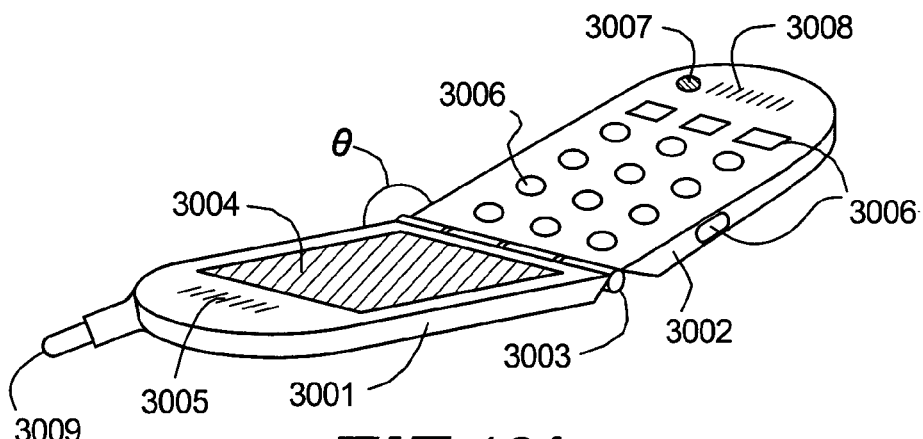
FIGS. 16A to 16C show an example of an electric appliance.

FIG. 16A is a portable telephone which comprises: a display panel 3001; an operation panel 3002. The display panel 3001 and the operation panel 3002 are connected each other at the connection portion 3003. An angle θ formed by a surface on which the display portion 3004 of the display panel 3001 is located and a surface on which the operational key 3006 of the operational panel 3002 is located can be arbitrarily changed in the connection portion 3003. In addition, the portable telephone comprises: a voice output portion 3005; an operation key 3006; a power source switch 3007; a voice input portion 3008. The present invention can be applied to the semiconductor device formed on the plastic substrate used for the display portion of the mobile phone. By applying the present invention, planarization can be realized without performing planarization process such as polishing process by CMP method and SOG film deposition.

Figure 16B:
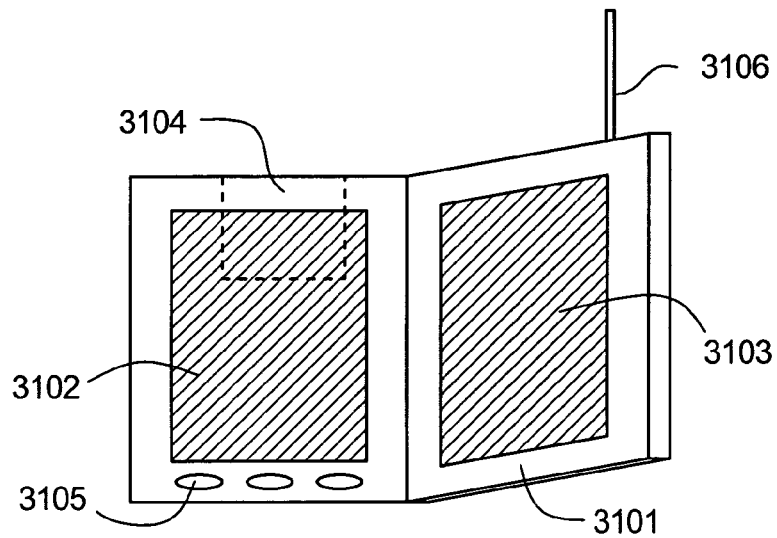

FIG. 16B is a portable book (electronic book) which comprises: a main body 3101; display portions 3102 and 3103; a recording medium 3104; operation switches 3105 and an antenna 3106 etc.

Figure 16C:
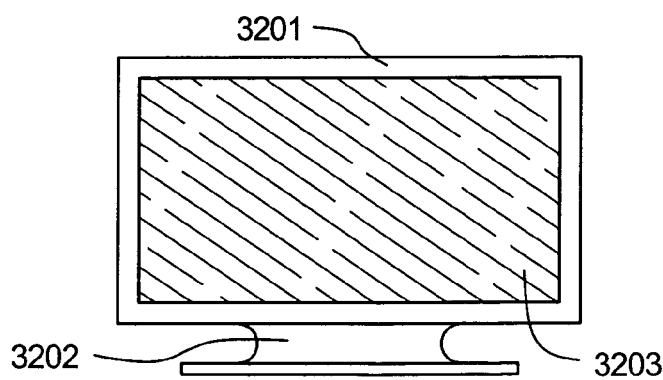

FIG. 16C is a display which comprises: a main body 3201; a supporting portion 3202; and a display portion 3203 etc. The planarization of the present invention can be applied to the electric devices formed by using large glass substrates that is easy to bend and is repand like displays.

As described above, the applicable range of the present invention is very large, and the invention can be applied to electronic devices of various areas. Note that the electronic devices of the present embodiment can be achieved by utilizing any display devices formed by combining of constitutions in Embodiment Mode and Embodiments 1 to 5.

(Embodiment 7)

In the embodiment 7, an example of multilayered wirings by using the invention will be described referring to FIG. 17A and FIG. 17B. However, the embodiment is described by using the production process of the TFT of the embodiments 2 and 5 in FIG. 17A and FIG. 17B, it is not limited to those, the embodiment and the embodiment 1 to 4 are also applicable. Since the production process of the TFT in FIG. 17A and FIG. 17B may follow the embodiment 2, the In the embodiment 7, though each concentration of the impurities doped in a source region and a drain region is equal, the concentration may be varied by using the LDD structure or a GOLD structure if necessary, and the number of gates is not limited to one, it may be two or more. The number of layers of wiring is not limited to the example in FIG. 17A and FIG. 17B, the number of layers of wiring may be more than or lower than the example in FIG. 17A and FIG. 17B.

Figure 17A:
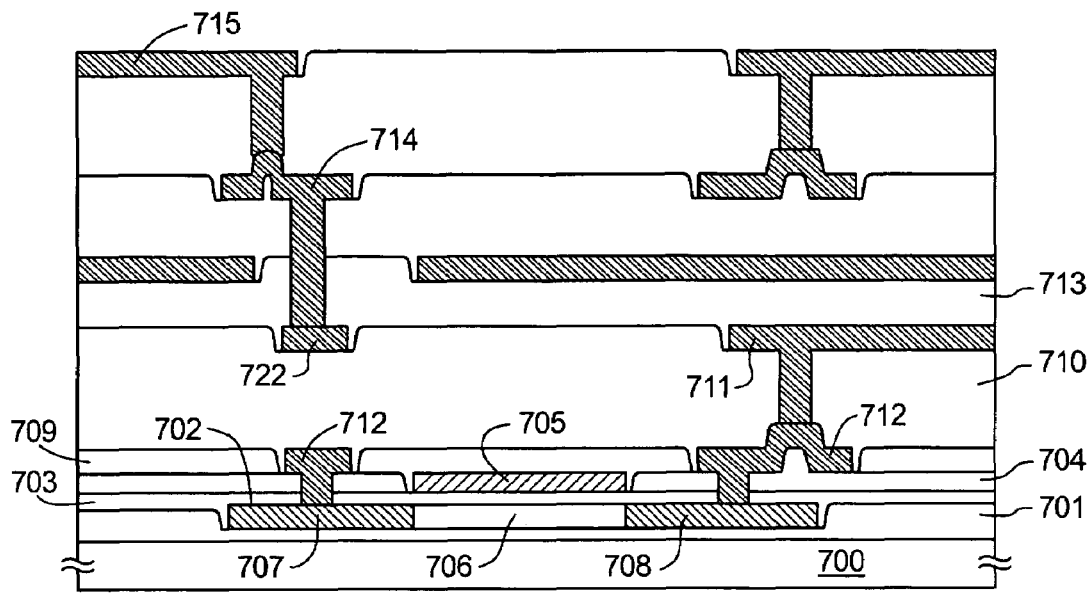
FIG. 17A and FIG. 17B show an example of an embodiment of the invention.

A TFT formed in FIG. 17A includes underlying dielectric film 701 having an aperture, a semiconductor film 702 formed in the aperture portion provided in the underlying dielectric film 701, a gate insulator film 703 coating over the underlying dielectric film 701 and the semiconductor film 702, a first dielectric film 704 having an aperture portion provided on the gate insulator film 703, and a gate electrode 705 formed in the aperture portion provided in the first dielectric film 704. The semiconductor film 702 includes a channel forming region 706 and n-type of impurity regions 707 and 708.

The underlying dielectric film 701 is formed on a substrate 700. A first interlayer dielectric film 709 coating over the gate electrode 705 of the n-channel type of TFT and the first dielectric film 704 are formed. An aperture portion is provided in the first interlayer dielectric film 709, in a bottom portion of the aperture portion wirings 711 and 712 are formed through contact holes which are provided such that the contact holes are in contact with the impurity regions 707 and 708 respectively. The wiring 711 is formed by the method shown in the embodiment 4. The first interlayer dielectric film 709 is coated with a second interlayer dielectric film 710, and an aperture portion for storing wiring is provided in the second interlayer dielectric film 710. The wiring 711 is electrically connected to other TFTs through the contact hole provided in the second interlayer dielectric film 710 and a surface of the second interlayer dielectric film 710. The second interlayer dielectric film 710 is coated with a third interlayer dielectric film 713 with an aperture portion. An aperture portion is also provided in the third interlayer dielectric film 713, and a wiring is stored in the aperture portion. Wirings in upper layers are built-in in the same way.

Figure 1A:
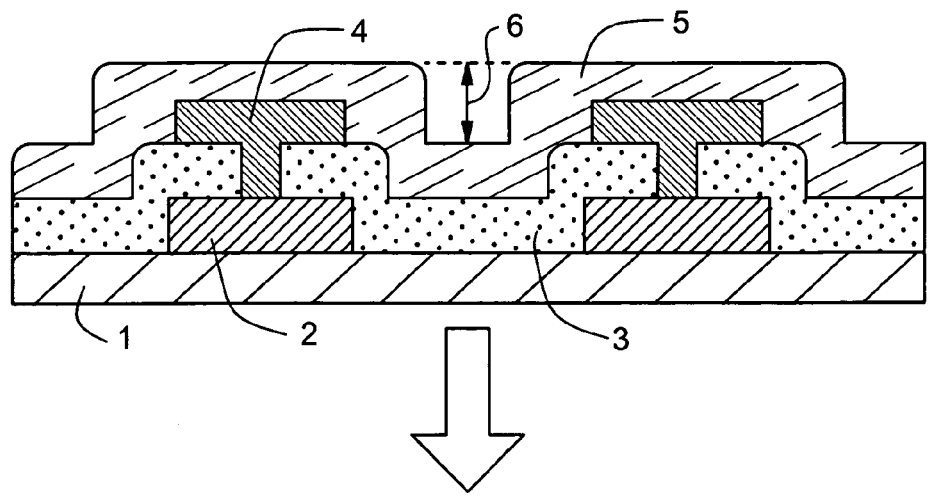
FIGS. 1A to 1C show a conventional example.
Figure 1B:
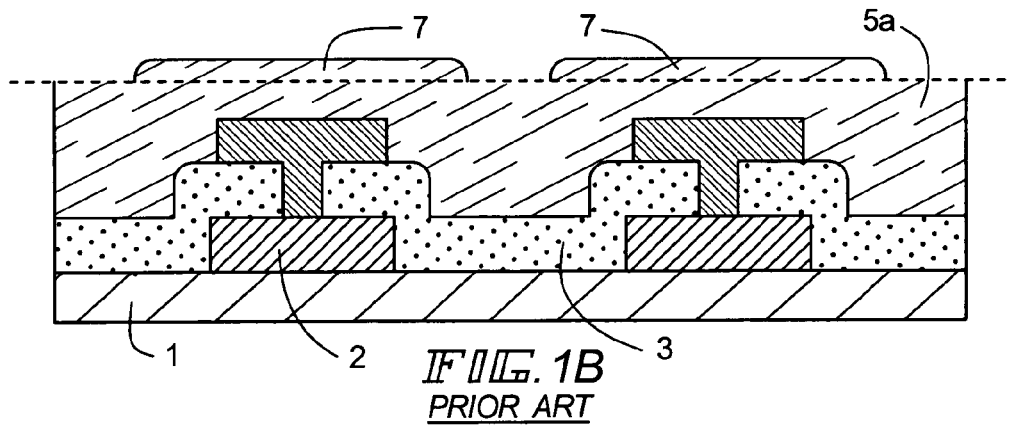
Figure 1C:
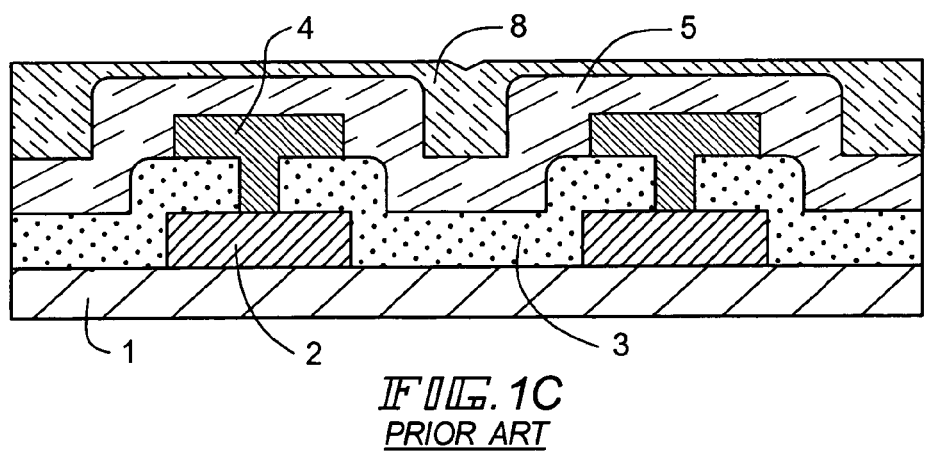
Figure 17B:
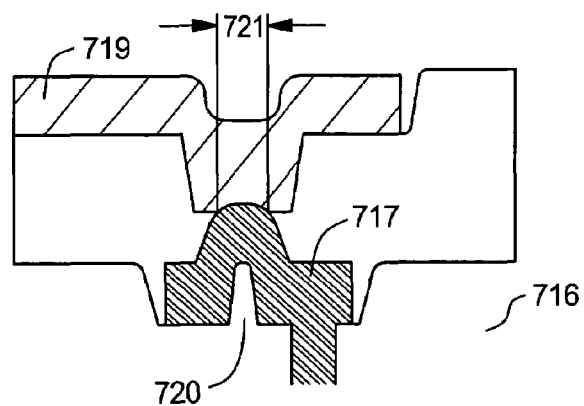

FIG. 17B shows an enlarge view near wfings wirings 714 and 715. Thes wirings 714 and 715 correspond to wirings 717 and 719 respectively. A dielectric film 720, which is provided under the wiring projecting toward an upper portion of an aperture portion among wirings formed inside and outside the aperture portion of a dielectric film 716, is formed as fine as possible for example, sub-micron meter, by using side etching of the wet etching. As a result, a width of the wiring projecting toward the upper portion of the aperture of the dielectric film 716 becomes the sum of the width of the micro-fabricated dielectric film 720 and a double of the film thickness of the wirings, concretely about 1 to 1.5 μm. At this state, when a step corresponding to 906 in FIG. 1 2B is removed to make a contact hole, a bottom surface of the contact hole can be formed in a shape which a head of the lower wiring is exposed convexly. The dielectric film under the wiring, may be formed in a shape of an island remaining in the aperture portion, or two aperture portions adjacent each other may be formed.

At this point, an effective diameter of the contact hole is 721, and is smaller than the diameter of the initial contact hole and also than the convex portion of the wiring 717 which is formed projecting from the aperture portion of the dielectric film 716. As described above, the effective diameter of the contact hole 721 can be reduced smaller than the diameter of the contact hole which is made initially. This allows the overlap margin of the wiring 719 to be reduced, so that improvement of the integration of the wiring can be made easy.

Compared with a case that a contact hole having dimensions corresponding to the contact hole 721 is formed to connect the wiring 719 with the wiring 717, the film thickness of the wiring 719 in the contact hole can be thickened because of the smaller aspect ratio of the contact hole. Accordingly, it is difficult to generate the disconnection in the contact hole and increment of contact resistance caused by thinning the film thickness of the wiring in the contact hole, which permits the reliability concerning the contact hole.

Because the integration of TFT can be achieved by the multilayered wirings according to the structure described above, an occupied area of TFT on a substrate of a semiconductor device can be reduced by using the TFT of the embodiments. In the structure described above, generally the concavity and the convexity are increased as the number of layers is increased, so that defects such as the disconnection is increased, however the defects such as the disconnection can be reduced and the improvement of the reliability can be achieved in a maimer that the smoothing surface can be done by utilizing the invention without the smoothing process by the polishing of the CMP method or by the SOG film.

In the embodiment aperture portions are formed in a dielectric film 716 to form a micro-fabricated dielectric film 720, but this process may be omitted if another dielectric film (a protrusion) is formed on the dielectric film 716 in spite of a micro-fabricated dielectric film 720. The height of the dielectric film (the protrusion) may be adjusted by a designer.

By applying the invention, the smoothing surface of the interlayer dielectric film can be achieved by an existent apparatus without smoothing process by a new apparatus for the CMP method or the SOG film to the interlayer dielectric film.

Even though the polishing technique by the CMP method is used, the smoothing process can be done only by easy polishing treatment because the almost smooth surface is achieved beforehand.

This allows accuracy of a micro-fabrication such as the reduced projection to be improved, so that the semiconductor device such as LSI which increment of the integration is required can enhance the integration and performance. In liquid crystal display apparatus, since the rubbing treatment can be done uniformly, the disturbance of the alignment of the liquid crystal does not occur, and good display can be done. Furthermore, since it is not necessary to form a light shield film provided for preventing reduction of picture quality from the disturbance of the alignment, the numerical aperture can be increased, which results in the improvement of brightness and the improvement of the display quality.

Furthermore, since the aspect ration of the contact hole is reduced, defects concerning the contact hole such as the disconnection can be reduced, which permits the reliability to be improved.

What is claimed is:
1. A semiconductor device comprising:
a first dielectric film having an aperture portion,
a semiconductor layer formed in the aperture portion, and
a second dielectric film over the first dielectric film and the semiconductor layer,
wherein the second dielectric film contacts an upper surface outside the aperture portion of the first dielectric film and extends into the aperture portion to contact an inner side surface of the first dielectric film and a side surface of the semiconductor layer.
2. A semiconductor device comprising:
a first dielectric film having an aperture portion,
a wiring formed continuously from a bottom surface of the aperture portion to a first upper surface outside the aperture portion of the first dielectric film, and
a second dielectric layer coating over the first dielectric layer and the wiring,
wherein, in the second dielectric layer, a contact hole reached to the wiring is formed at a position where the wiring is formed on the first upper surface,
wherein a depth of said aperture portion is shorter than a thickness of said first dielectric film, and
wherein the second dielectric film contacts a second upper surface outside the aperture portion of the first dielectric film.
3. A semiconductor device comprising:
a first dielectric film having a first aperture portion,
a wiring formed continuously from a bottom surface of the first aperture portion to a first upper surface outside the aperture portion of the first dielectric film, and
a second dielectric film coating over the first dielectric layer and the wiring and having a second aperture portion,
wherein at least a part of the second aperture portion is formed on an upper portion of a position where the wiring is formed on the first upper surface, and a contact hole reached to the wiring is formed corresponding to the position of a bottom surface of the second aperture portion, and
wherein the second dielectric film contacts a second upper surface outside the aperture portion of the first dielectric film.
4. A semiconductor device according to claim 3,
wherein a value of a depth of said first aperture portion is equal to a value of a thickness of said wiring.
5. A semiconductor device comprising:
a first dielectric film having a first aperture portion and a second aperture portion adjacent to the first aperture portion;
a wiring formed continuously from a bottom surface of the first aperture portion to a bottom surface of the second aperture portion through a first upper surface of the first dielectric film between the first aperture portion and the second aperture portion; and
a second dielectric film over the first dielectric film and the wiring,
wherein the second dielectric film contacts a second upper surface outside the first aperture portion and the second aperture portion of the first dielectric film and extends into the first aperture portion and the second aperture portion to contact an inner side surface of the first dielectric film and a side surface of the wiring.
6. A semiconductor device according to claim 5, wherein a value of a depth of said first aperture portion and said second aperture portion is equal to a value of a thickness of said wiring.

7. A semiconductor device comprising:
a first dielectric film having a first aperture portion and a second aperture portion adjacent to the first aperture portion,
a wiring formed continuously from a bottom surface of the first aperture portion to a bottom surface of the second aperture portion through a first upper surface of the first dielectric film between the first aperture portion and the second aperture portion, and
a second dielectric film coating over the first dielectric layer and the wiring,
wherein, in the second dielectric layer, a contact hole reached to the wiring is formed at a position where the wiring is formed on the first upper surface of the first dielectric film between the first aperture portion and the second aperture portion, and
wherein the second dielectric film contacts a second upper surface outside the first aperture portion and the seond aperture portion of the first dielectric film.

8. A semiconductor device according to claim 7, wherein a value of a depth of said first aperture portion and said second aperture portion is equal to a value of a thickness of said wiring.

9. A semiconductor device comprising:
a first dielectric film having a first aperture portion and a second aperture portion adjacent to the first aperture portion,
a wiring formed continuously from a bottom surface of the first aperture portion to a bottom surface of the second aperture portion through a first upper surface of the first dielectric film between the first aperture portion and the second aperture portion, and
a second dielectric film coating over the first dielectric layer and the wiring and having a third aperture portion,
wherein at least a part of the third aperture portion is formed on an upper portion of a position where the wiring is formed on the first upper surface of the second dielectric film between the first aperture portion and the second aperture portion, and a contact hole reached to the wiring is formed corresponding to the position of a bottom surface of the third aperture portion, and
wherein the second dielectric film contacts a secod upper surface outside the first aperture portion and the second aperture portion of the first dielectric film.

10. A semiconductor device according to claim 9, wherein a value of a depth of said first aperture portion and said second aperture portion is equal to a value of a thickness of said wiring.

11. A semiconductor device comprising:
a first dielectric film having an aperture portion which is formed with the first dielectric film remained in an island shape inside the aperture portion;
a wiring formed continuously inside the aperture portion and on an upper portion of the first dielectric film remained in the island shape; and
a second dielectric film over the first dielectric film and the wiring,
wherein the second dielectric film contacts an upper surface outside the aperture portion of the first dielectric film and extends into the aperture portion to contact an inner side surface of the first dielectric film and a side surface of the wiring.

12. A semiconductor device according to claim 11, wherein a value of a depth of said aperture portion is equal to a value of a thickness of said wiring.

13. A semiconductor device comprising:
a first dielectric film having an aperture portion which is formed with the first dielectric film remained in an island shape inside the aperture portion,
a wiring formed continuously inside the aperture portion and on an upper portion of the first dielectric film remained in the island shape, and
a second dielectric film coating over the first dielectric film and the wiring,
wherein, in the second dielectric film, a contact hole reached to the wiring is formed at a position where the dielectric film remained in the island shape is formed, and
wherein the second dielectric film contacts an upper surface outside the aperture portion of the first dielectric film.

14. A semiconductor device according to claim 13, wherein a value of a depth of said aperture portion is equal to a value of a thickness of said wiring.

15. A semiconductor device comprising:
a first dielectric film having a first aperture portion which is formed with the first dielectric film remained in an island shape inside the aperture portion,
a wiring formed continuously inside the first aperture portion and on an upper portion of the first dielectric film remained in the island shape, and
a second dielectric film coating over the first dielectric film and the wiring and having a second aperture portion,
wherein at least a part of the second aperture portion is formed on an upper portion of a position where the wiring is formed on the upper portion of the first dielectric film remained in the island shape, and a contact hole reached to the wiring is formed corresponding to the position of a bottom surface of the second aperture portion, and
wherein the second dielectric film contacts an upper surface outside the first aperture portion of the first dielectric film.

16. A semiconductor device according to claim 15, wherein a value of a depth of said first aperture portion is equal to a value of a thickness of said wiring.

17. A semiconductor device according to claim 15, wherein a value of a depth of said first aperture portion and said second aperture portion is equal to a value of a thickness of said wiring.

18. A semiconductor device comprising:
a semiconductor film including a first impurity region and a second impurity region over an insulating surface;
a gate insulating film adjacent to said semiconductor film;
a gate electrode adjacent to said gate insulating film;
a first insulating film over said semiconductor film;
a second insulating film having a first aperture portion and a second aperture portion over said first insulating film, wherein a first projection is provided inside the first aperture portion;
a first wiring formed in said first aperture portion and covering said first projection, wherein said first wiring is electrically connected to the first impurity region;
a second wiring formed in said second aperture portion, wherein said second wiring is electrically connected to the second impurity region; and
a third insulating film over the first wiring, the second wiring and the second insulating film,
wherein the third insulating film contacts an upper surface outside the first aperture portion and the second aperture portion of the second insulating film.

19. The semiconductor device according to claim 18 further comprising:
a third insulating film having a third aperture portion and a fourth aperture portion over said first wiring and said second wring;
a third wiring formed in said third aperture portion; and
a fourth wiring formed in said fourth aperture portion;
wherein said third wiring is electrically connected to said first wiring through a contact hole.

20. The semiconductor device according to claim 19 further comprising:
a fourth insulating film is formed over said third wiring and said fourth wiring, wherein said fourth insulating film has a fifth aperture portion and a second projection inside said fifth aperture portion, and a sixth aperture portion and a third projection inside said sixth aperture portion;
a fifth wiring formed in said fifth aperture portion and covering said second projection; and
a sixth wiring formed in said sixth aperture portion and covering said third projection, wherein said sixth wiring is electrically connected to the fourth wiring through a contact hole.

21. The semiconductor device according to claim 20 further comprising:
a fifth insulating film having a seventh aperture portion and a eighth aperture portion formed over said fifth wiring and said sixth wiring;
a seventh wiring formed in said seventh aperture portion; and
a eighth wiring formed in said eighth aperture portion;
wherein said seventh wiring is electrically connected to said fifth wiring through a contact hole, and
wherein said eighth wiring is electrically connected to said sixth wiring through a contact hole.

22. A semiconductor device comprising:
a first dielectric film having an aperture portion,
a semiconductor layer formed in the aperture portion, and
a second dielectric film coating the first dielectric film and the semiconductor layer, wherein the second dielectric film contacts a top surface outside the aperture portion of the first dielectric film and extends into the aperture portion to contact an inner side surface of the first dielectric film and a side surface of the semiconductor layer,
wherein the semiconductor layer is formed so that a top surface of said semiconductor layer is leveled with the top surface outside the aperture portion of the first dielectric film.

23. The semiconductor device according to claim 2, wherein a depth of said aperture portion is equal to a thickness of said wiring.

24. The semiconductor device according to claim 18, wherein a top surface of said first wiring is leveled with a top surface of said first dielectric film.

25. The semiconductor device according to claim 19, wherein a value of depth of the third aperture portion, a value of depth of the fourth aperture portion, a value of thickness of the third wiring and a value of thickness of the forth wiring are equal.

26. The semiconductor device according to claim 1, wherein a depth of said aperture portion is equal to a thickness of said semiconductor layer.

27. The semiconductor device according to claim 22, wherein a value of a depth of said aperture portion is equal to a value of a thickness of said semiconductor layer.

28. The semiconductor device according to claim 18, wherein the first projection is extended from the first insulating film.

29. A semiconductor device comprising:
a first dielectric film having an aperture portion and a projection inside the aperture portion;
a first wiring formed in said aperture portion and covering said projection;
a second dielectric film formed over said first dielectric film and said first wiring, said second dielectric film having a contact hole;
a second wiring formed over said second dielectric film wherein said second wiring is electrically connected to said first wiring through said contact hole,
wherein the second dielectric film contacts an upper surface outside the aperture portion of the first dielectric film.

30. The semiconductor device according to claim 29, wherein said second wiring is in direct contact with a top surface of said first wiring, said top surface being located over said projection.

31. The semiconductor device according to claim 29, wherein a depth of said aperture portion is equal to a thickness of said first wiring.

32. A semiconductor device comprising:
a first dielectric film having a first aperture portion and a projection inside the first aperture portion;
a first wiring formed in said first aperture portion and covering said projection;
a second dielectric film formed over said first dielectric film and said first wiring, said second dielectric film having a second aperture portion and a contact hole in said second aperture portion;
a second wiring formed in said second aperture portion, wherein said second wiring is electrically connected to said first wiring through said contact hole,
wherein the second dielectric film contacts an upper surface outside the first aperture portion of the first dielectric film.

33. The semiconductor device according to claim 32, wherein said second wiring is in direct contact with a top surface of said first wiring, said top surface being located over said projection.

34. The semiconductor device according to claim 32, wherein a depth of said first aperture portion is equal to a thickness of said first wiring.

35. The semiconductor device according to claim 20, wherein a value of depth of the fifth aperture portion, a value of depth of the sixth aperture portion, a value of thickness of the fifth wiring and a value of thickness of the sixth wiring are equal.

* * * * *